(12) United States Patent
Suen et al.

(10) Patent No.: US 11,728,215 B2
(45) Date of Patent: *Aug. 15, 2023

(54) FIN FIELD-EFFECT TRANSISTOR DEVICE AND METHOD OF FORMING THE SAME

(71) Applicant: Taiwan Semiconductor Manufacturing Co., Ltd., Hsinchu (TW)

(72) Inventors: Shich-Chang Suen, Hsinchu (TW); Kei-Wei Chen, Tainan (TW); Liang-Guang Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 82 days.

This patent is subject to a terminal disclaimer.

(21) Appl. No.: 17/333,090

(22) Filed: May 28, 2021

(65) Prior Publication Data

US 2021/0296173 A1 Sep. 23, 2021

Related U.S. Application Data

(63) Continuation of application No. 16/701,326, filed on Dec. 3, 2019, now Pat. No. 11,024,540, which is a
(Continued)

(51) Int. Cl.
*H01L 21/70* (2006.01)
*H01L 21/768* (2006.01)
(Continued)

(52) U.S. Cl.
CPC .... *H01L 21/76897* (2013.01); *H01L 21/0217* (2013.01); *H01L 21/02126* (2013.01);
(Continued)

(58) Field of Classification Search
CPC combination set(s) only.
See application file for complete search history.

(56) References Cited

U.S. PATENT DOCUMENTS

| 6,403,482 B1 | 6/2002 | Rovedo et al. |
| 8,373,239 B2 | 2/2013 | Siddiqui et al. |

(Continued)

FOREIGN PATENT DOCUMENTS

| CN | 102194756 A | 9/2011 |
| CN | 103681356 A | 3/2014 |

(Continued)

*Primary Examiner* — Niki H Nguyen
(74) *Attorney, Agent, or Firm* — Slater Matsil, LLP

(57) ABSTRACT

A method includes forming a first gate structure over a substrate, where the first gate structure is surrounded by a first dielectric layer; and forming a mask structure over the first gate structure and over the first dielectric layer, where forming the mask structure includes selectively forming a first capping layer over an upper surface of the first gate structure; and forming a second dielectric layer around the first capping layer. The method further includes forming a patterned dielectric layer over the mask structure, the patterned dielectric layer exposing a portion of the mask structure; removing the exposed portion of the mask structure and a portion of the first dielectric layer underlying the exposed portion of the mask structure, thereby forming a recess exposing a source/drain region adjacent to the first gate structure; and filling the recess with a conductive material.

20 Claims, 30 Drawing Sheets

Related U.S. Application Data continuation of application No. 16/104,006, filed on Aug. 16, 2018, now Pat. No. 10,504,782.

(60) Provisional application No. 62/565,822, filed on Sep. 29, 2017.

(51) Int. Cl.

| | | |
|---|---|---|
| *H01L 21/02* | (2006.01) | |
| *H01L 29/66* | (2006.01) | |
| *H01L 21/311* | (2006.01) | |
| *H01L 21/285* | (2006.01) | |
| *H01L 21/033* | (2006.01) | |
| *H01L 29/78* | (2006.01) | |
| *H01L 23/522* | (2006.01) | |
| *H01L 21/28* | (2006.01) | |
| *H01L 21/3105* | (2006.01) | |
| *H01L 21/8238* | (2006.01) | |
| *H01L 21/3213* | (2006.01) | |
| *H01L 21/32* | (2006.01) | |

(52) U.S. Cl.
CPC .. *H01L 21/02211* (2013.01); *H01L 21/02227* (2013.01); *H01L 21/02271* (2013.01); *H01L 21/02301* (2013.01); *H01L 21/02312* (2013.01); *H01L 21/0337* (2013.01); *H01L 21/28247* (2013.01); *H01L 21/28525* (2013.01); *H01L 21/28568* (2013.01); *H01L 21/3105* (2013.01); *H01L 21/31116* (2013.01); *H01L 21/31144* (2013.01); *H01L 21/76802* (2013.01); *H01L 21/76826* (2013.01); *H01L 21/76829* (2013.01); *H01L 21/823821* (2013.01); *H01L 23/5226* (2013.01); *H01L 29/66545* (2013.01); *H01L 29/66795* (2013.01); *H01L 29/785* (2013.01); *H01L 21/32* (2013.01); *H01L 21/32134* (2013.01); *H01L 21/32135* (2013.01); *H01L 29/7848* (2013.01)

(56) References Cited

U.S. PATENT DOCUMENTS

| | | | |
|---|---|---|---|
| 8,421,077 B2 | 4/2013 | Jain et al. | |
| 8,815,672 B2 | 8/2014 | Lee et al. | |
| 9,166,024 B2 | 10/2015 | Hung et al. | |
| 9,312,179 B2 | 4/2016 | Lin et al. | |
| 9,362,283 B2 | 6/2016 | Hong et al. | |
| 9,515,163 B2 | 12/2016 | Xie et al. | |
| 9,548,366 B1 | 1/2017 | Kim et al. | |
| 9,620,610 B1 | 4/2017 | Jangjian et al. | |
| 9,741,824 B2 | 8/2017 | Tu | |
| 9,812,536 B2 | 11/2017 | Fu et al. | |
| 9,917,178 B2 | 3/2018 | Ching et al. | |
| 9,997,632 B2 | 6/2018 | Chang et al. | |
| 10,093,863 B2 | 9/2018 | Hsieh et al. | |
| 10,504,782 B2 * | 12/2019 | Suen | H01L 21/02211 |
| 2007/0023839 A1 | 2/2007 | Furukawa et al. | |
| 2008/0164522 A1 | 7/2008 | Mikasa | |
| 2009/0298247 A1 | 12/2009 | Kim | |
| 2012/0058609 A1 | 3/2012 | Lee et al. | |
| 2013/0178033 A1 * | 7/2013 | Bohr | H01L 29/16 438/299 |
| 2014/0361381 A1 | 12/2014 | Hung et al. | |
| 2015/0235897 A1 | 8/2015 | Feng et al. | |
| 2015/0263131 A1 | 9/2015 | Metz | |
| 2015/0279996 A1 * | 10/2015 | He | H01L 23/535 257/288 |
| 2016/0027901 A1 * | 1/2016 | Park | H01L 29/785 438/300 |
| 2017/0103948 A1 | 4/2017 | Lee et al. | |
| 2017/0162675 A1 | 6/2017 | Yim et al. | |

FOREIGN PATENT DOCUMENTS

| | | |
|---|---|---|
| CN | 104851806 A | 8/2015 |
| CN | 105448991 A | 3/2016 |
| CN | 105810736 A | 7/2016 |
| CN | 106252410 A | 12/2016 |
| CN | 106653833 A | 5/2017 |
| CN | 106887462 A | 6/2017 |
| EP | 2197028 A1 | 6/2010 |
| KR | 101721036 B1 | 3/2017 |
| TW | I533407 B | 5/2016 |
| TW | I557846 B | 11/2016 |
| TW | I596705 B | 8/2017 |
| WO | 2012145079 A1 | 10/2012 |

* cited by examiner

FIN FIELD-EFFECT TRANSISTOR DEVICE AND METHOD OF FORMING THE SAME

PRIORITY CLAIM AND CROSS-REFERENCE

This application is a continuation of U.S. patent application Ser. No. 16/701,326, filed Dec. 3, 2019, entitled "Fin Field-Effect Transistor Device and Method of Forming the Same," which is a continuation of U.S. patent application Ser. No. 16/104,006, filed Aug. 16, 2018, entitled "Fin Field-Effect Transistor Device and Method of Forming the Same," now U.S. Pat. No. 10,504,782 issued on Dec. 10, 2019, which claims priority to U.S. Provisional Patent Application No. 62/565,822, filed Sep. 29, 2017, entitled "Fin Field-Effect Transistor Device and Method of Forming the Same," which application are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming self-aligned contact plugs of a FinFET device. In accordance with some embodiments, a capping layer is selectively formed over a gate structure. The capping layer and spacers along sidewalls of the gate structure protect the gate structure from a subsequent etching process, which etching process removes portions of dielectric materials around the gate structure to expose the source/drain regions. Source/drain contact plugs are formed by filling the recesses. Although the disclosed embodiments are discussed using FinFET devices as examples, the disclosed method may also be used in other types of devices, such as planar devices.

Figure 1:
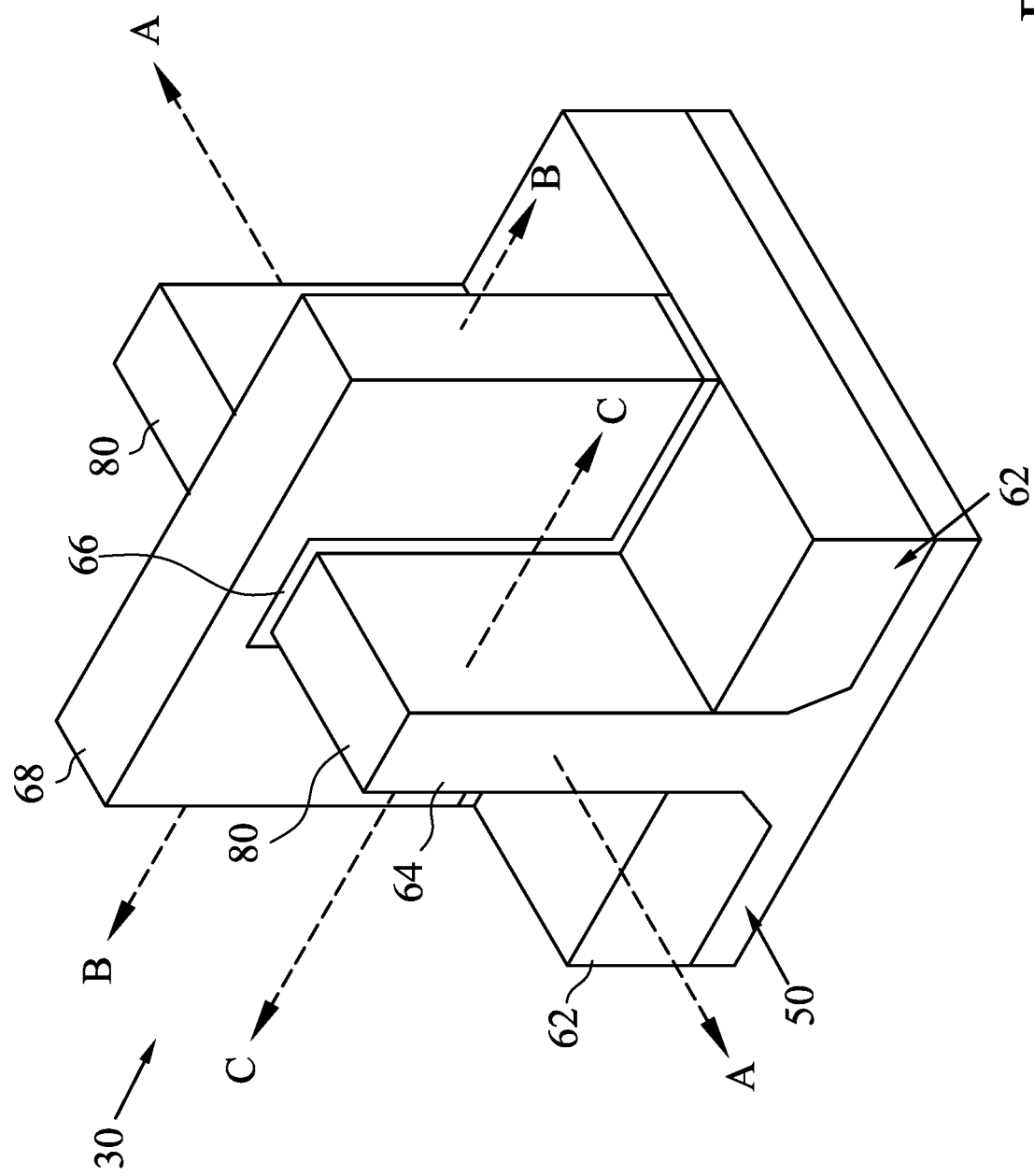
FIG. 1 illustrates a perspective view of a Fin Field-Effect Transistor (FinFET) device, in accordance with some embodiments.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate 68 is over the gate dielectric 66. Source/drain regions 80 are in the fin 64 and on opposing sides of the gate dielectric 66 and the gate 68. FIG. 1 further illustrates reference cross-sections that are used in later figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

Figure 6:
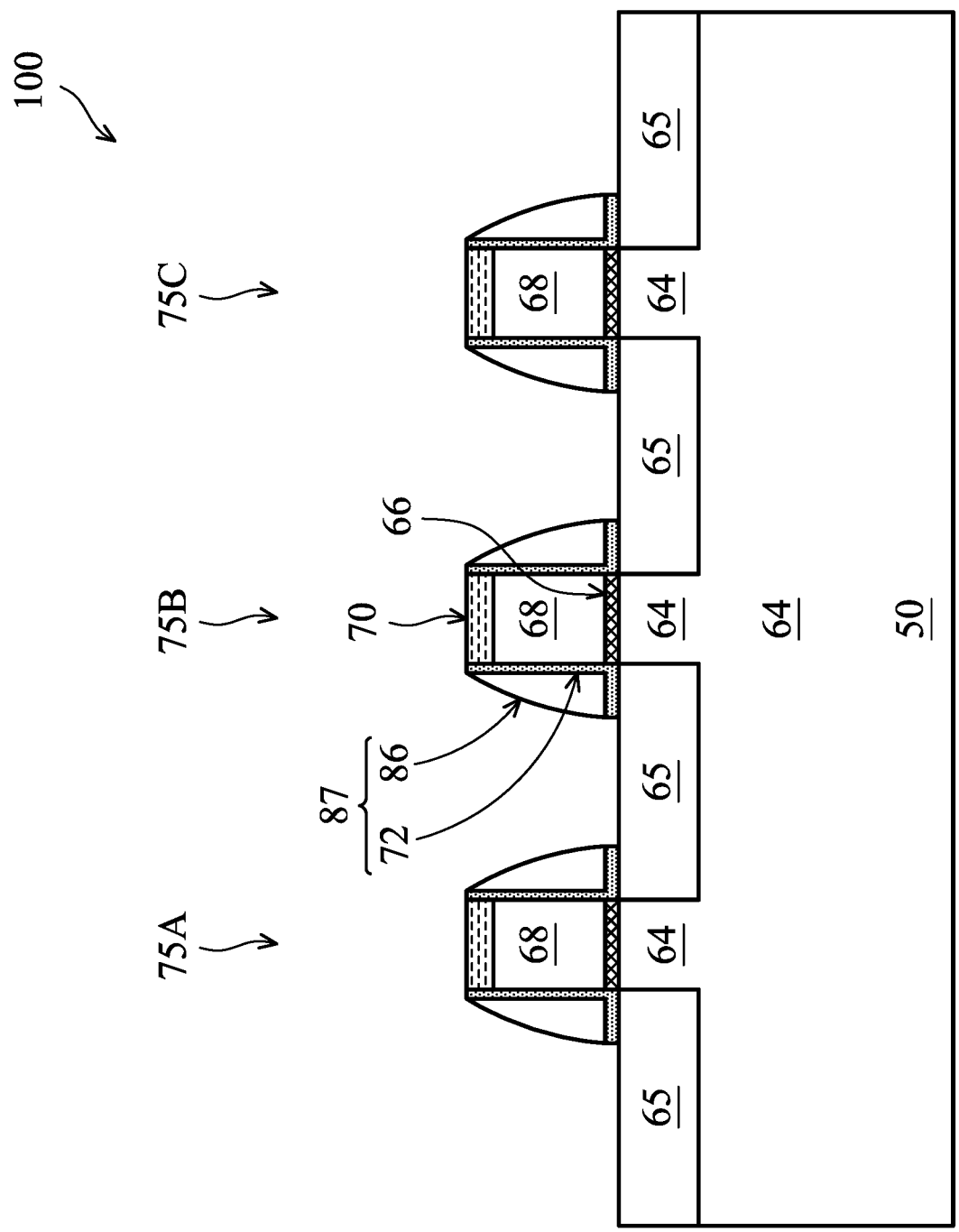
Figure 7A:
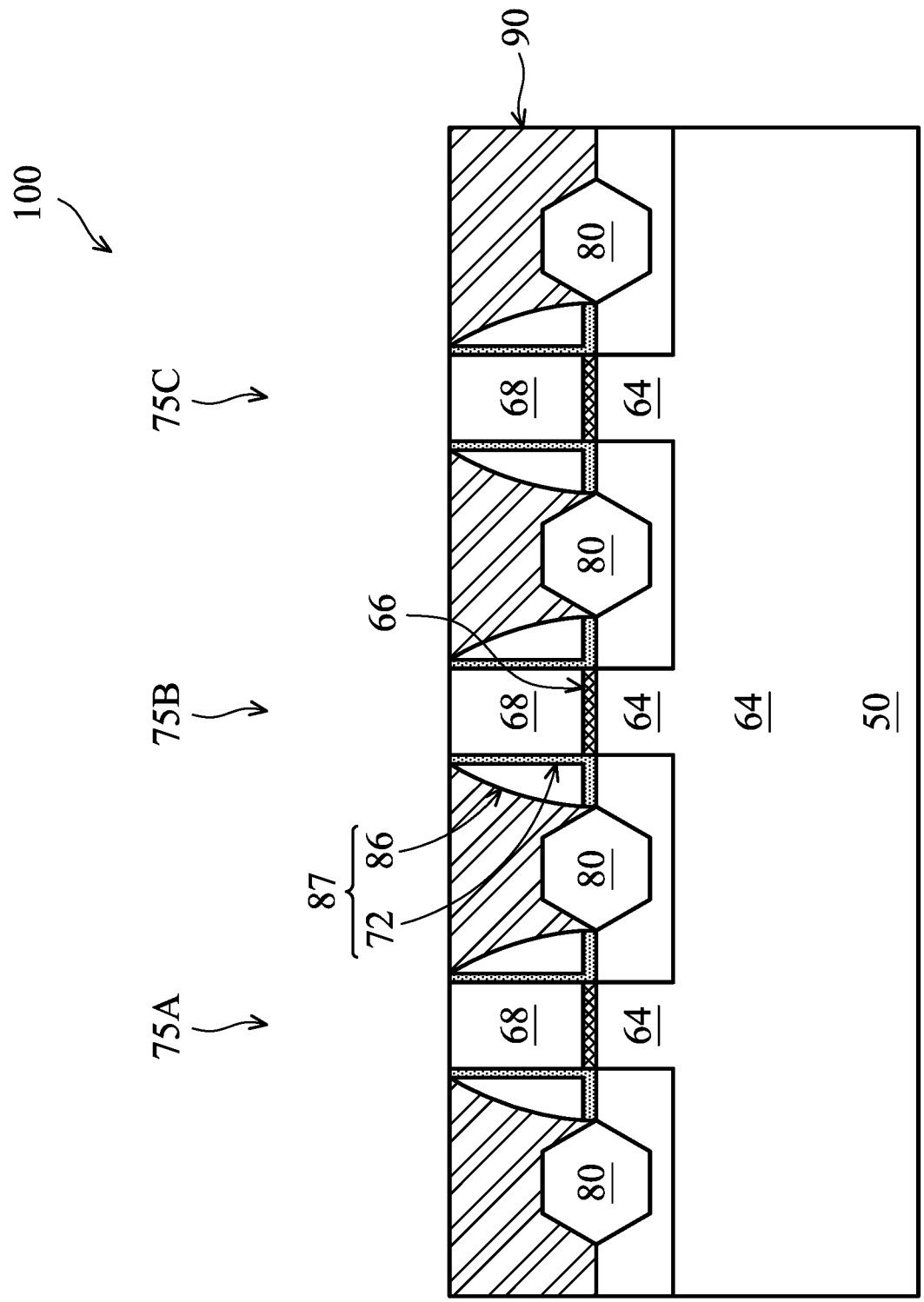
Figure 7B:
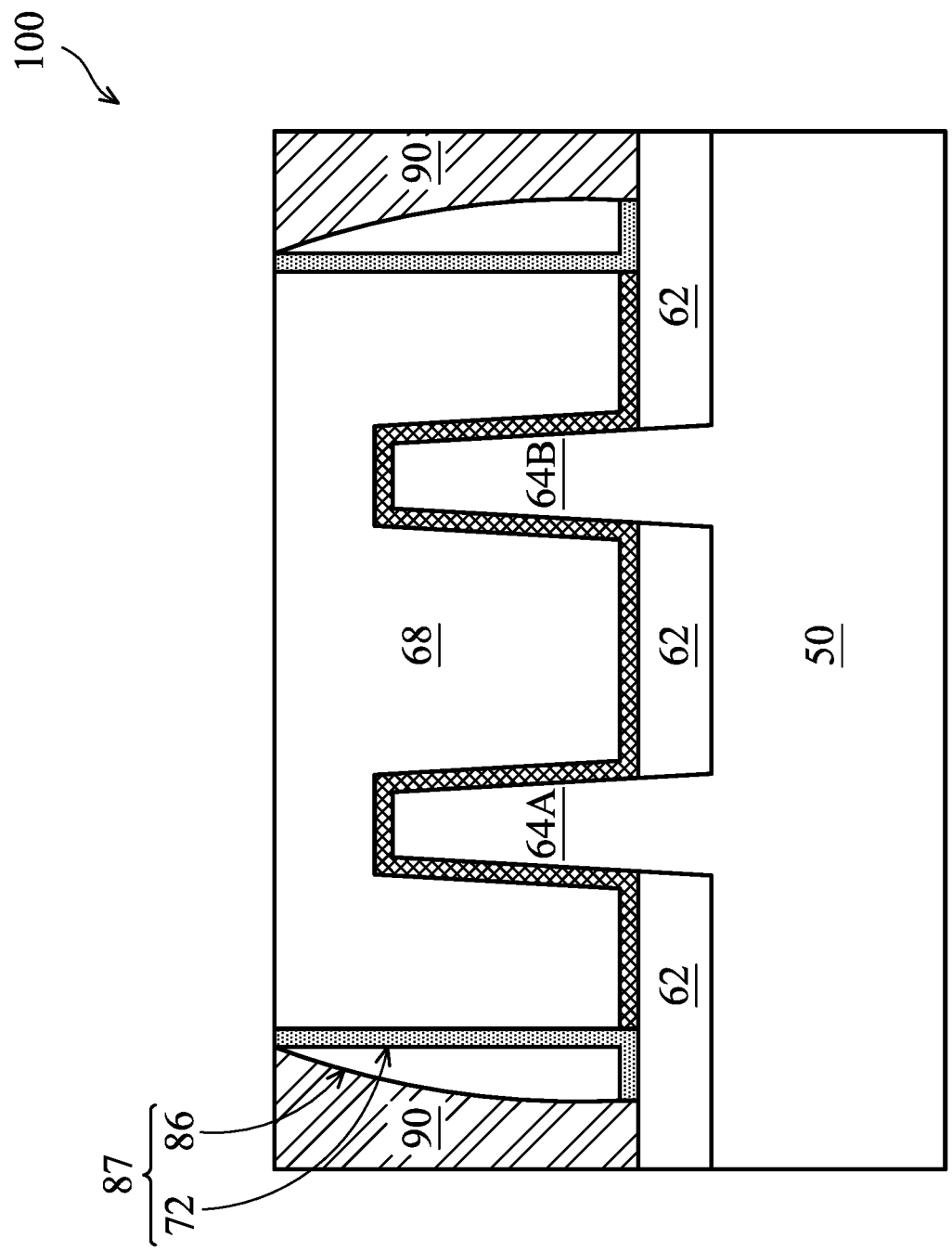
Figure 7C:
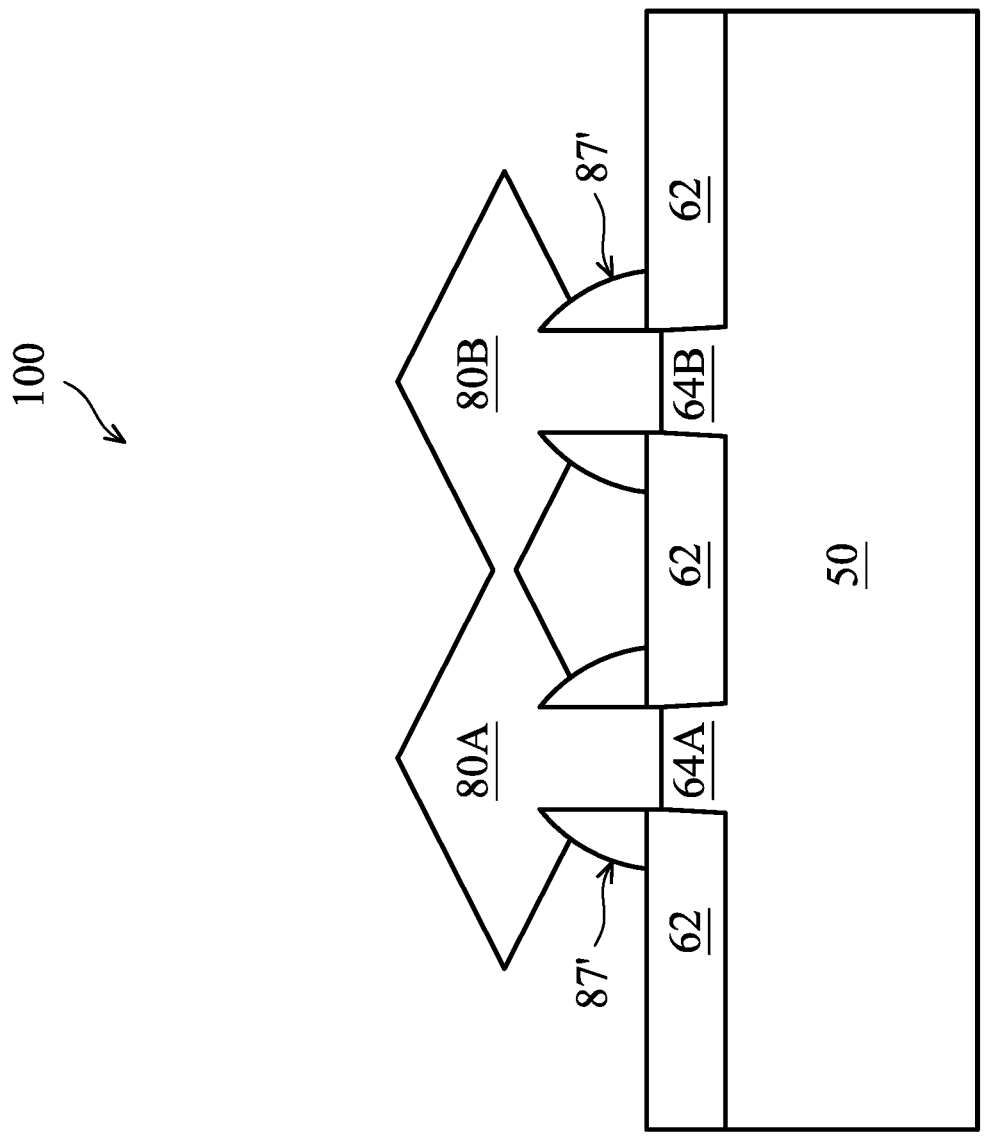
Figure 7D:
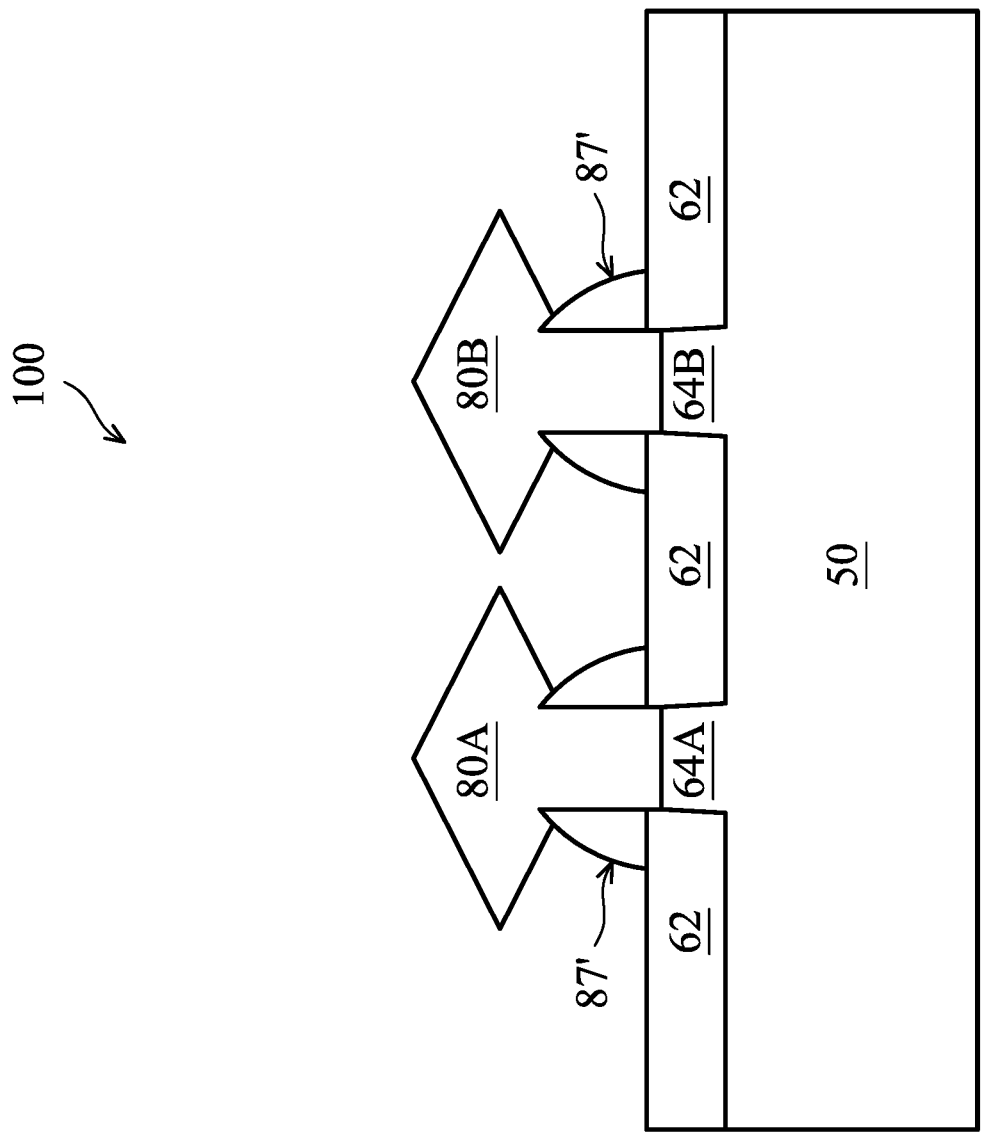

FIGS. 2-6, 7A-7D, and 8-16 are cross-sectional views of a FinFET device 100 at various stages of fabrication in accordance with an embodiment. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6 and 7A illustrate cross-sectional views of the FinFET device 100 along cross-section A-A, FIG. 7B illustrate a cross-sectional view of the FinFET device 100 along cross-section B-B, and FIGS. 7C and 7D illustrate cross-sectional views of the FinFET device 100 along cross-section C-C. FIGS. 8-15 illustrate cross-sectional views of the FinFET device 100 along cross-section A-A, and FIG. 16 illustrates cross-sectional views of the FinFET device 100 along cross-section B-B.

Figure 2:
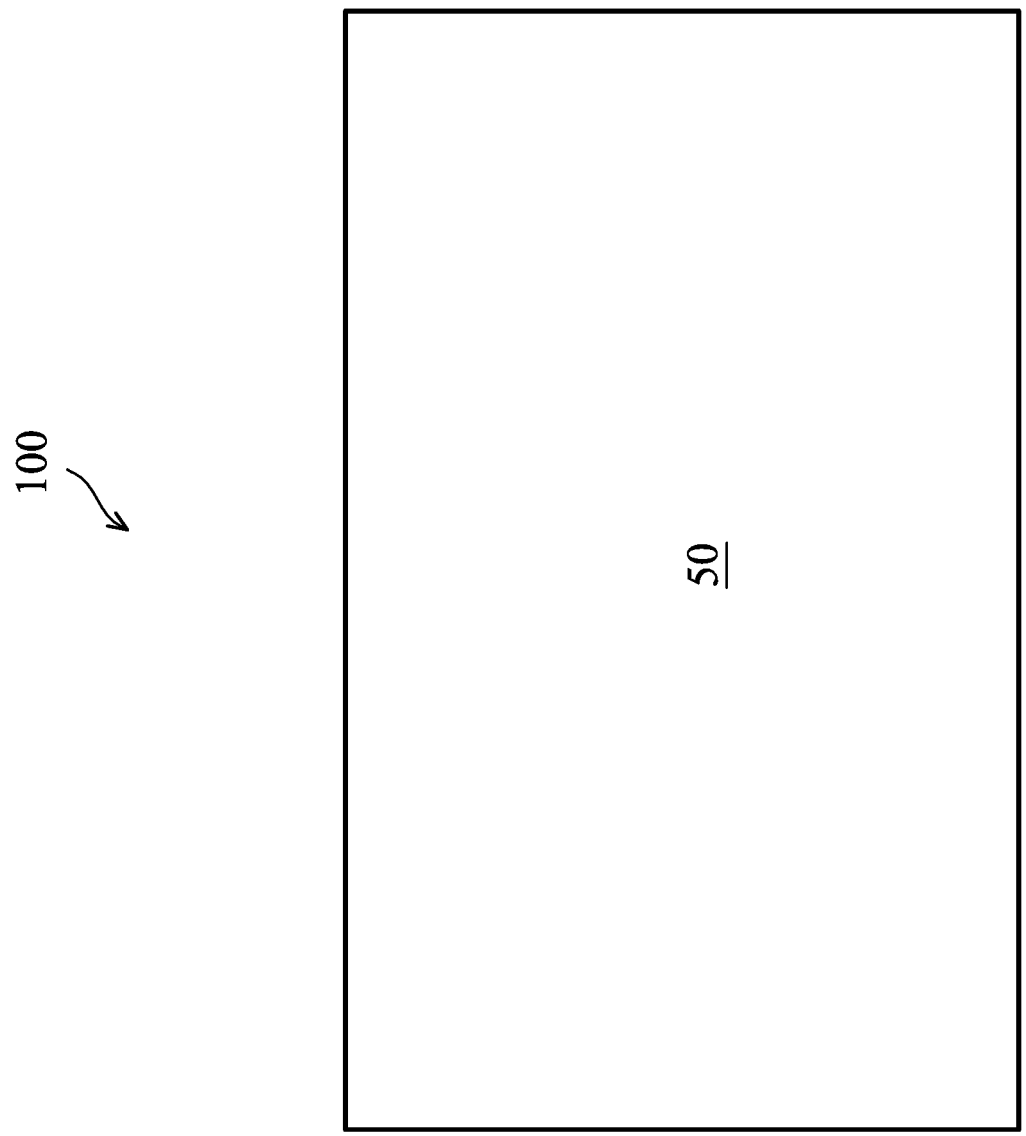
FIGS. 2-6, 7A-7D, and 8-16 illustrate cross-sectional views of a FinFET device at various stages of fabrication, in accordance with some embodiments.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
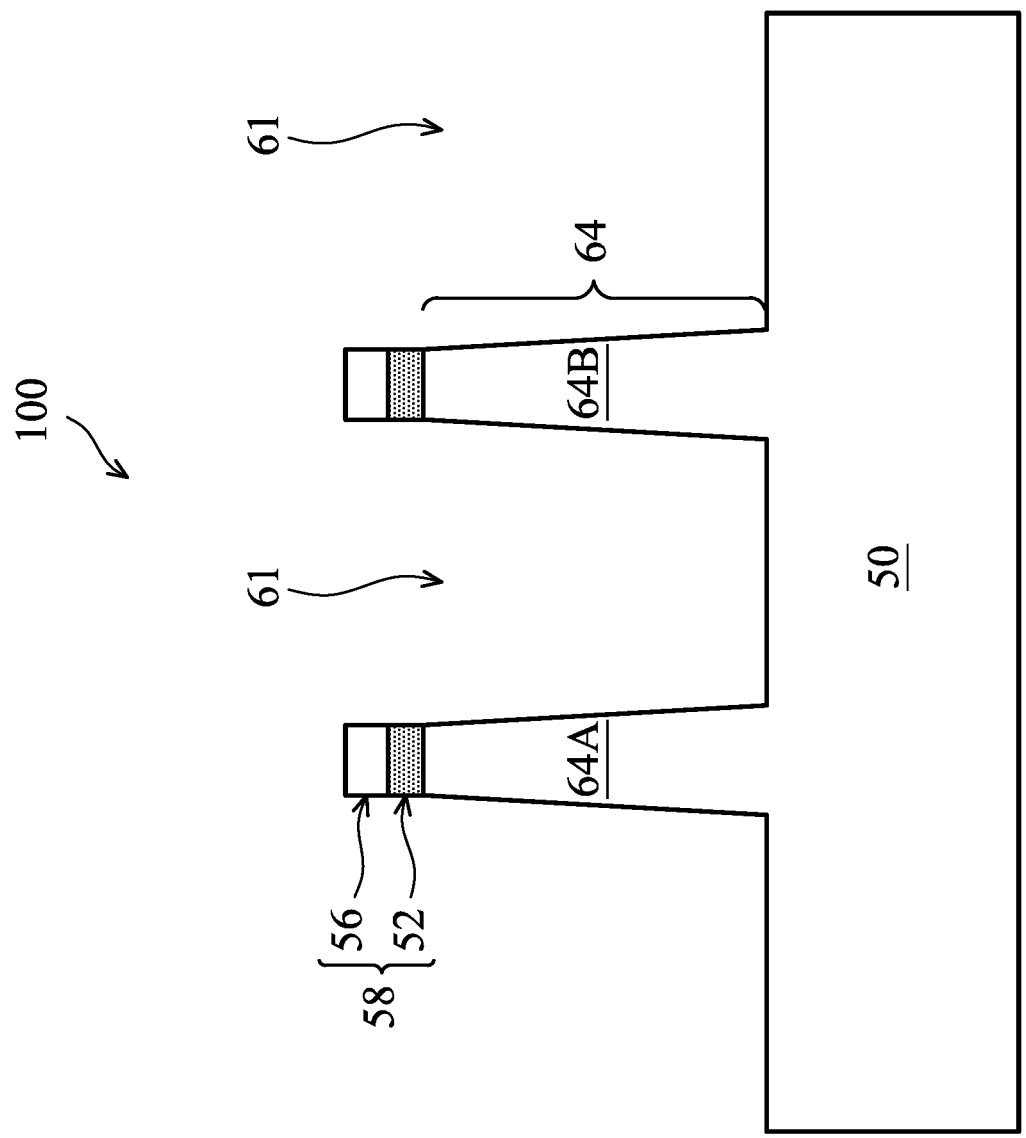

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
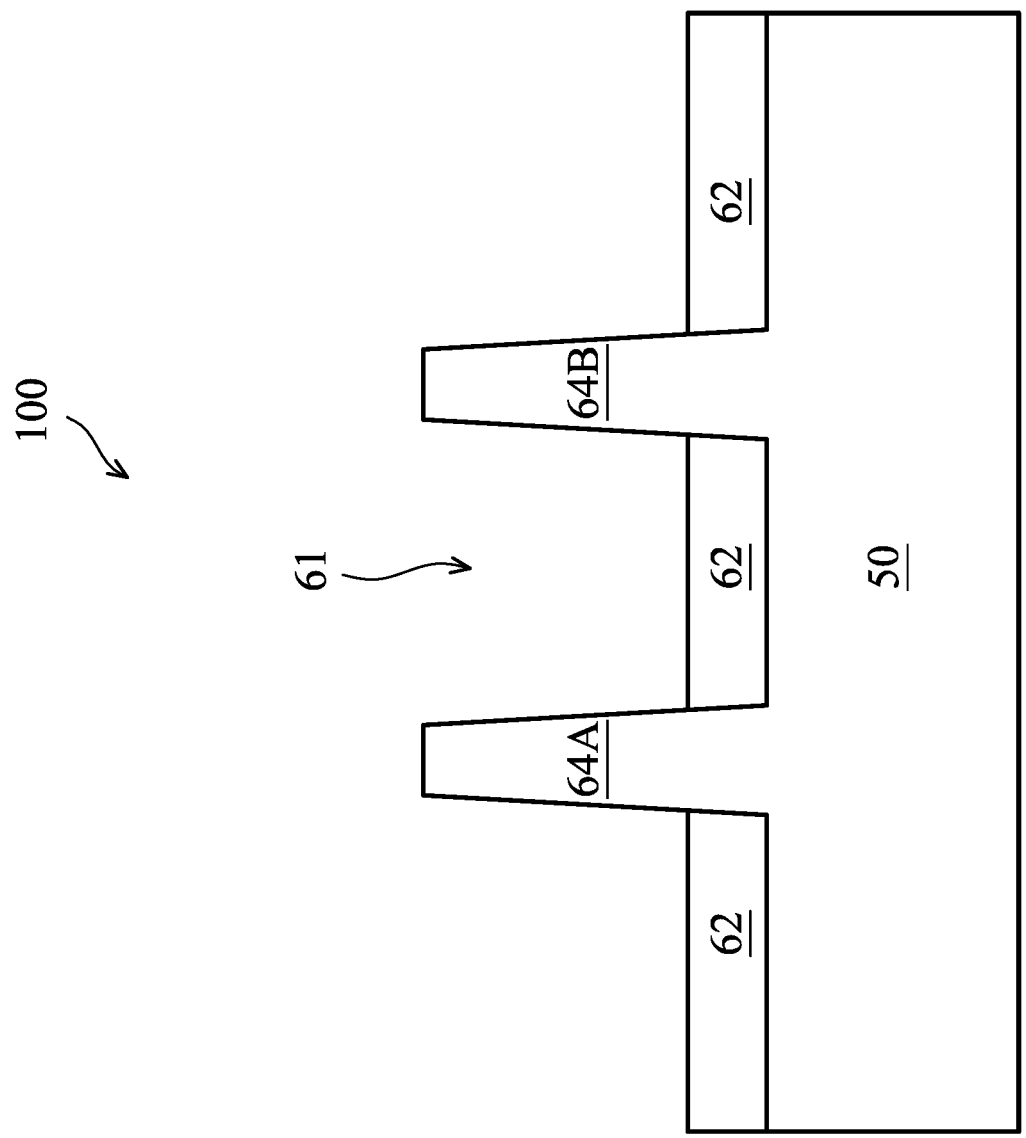

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask layer 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch or a wet etch using dilute hydrofluoric (dHF) acid may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
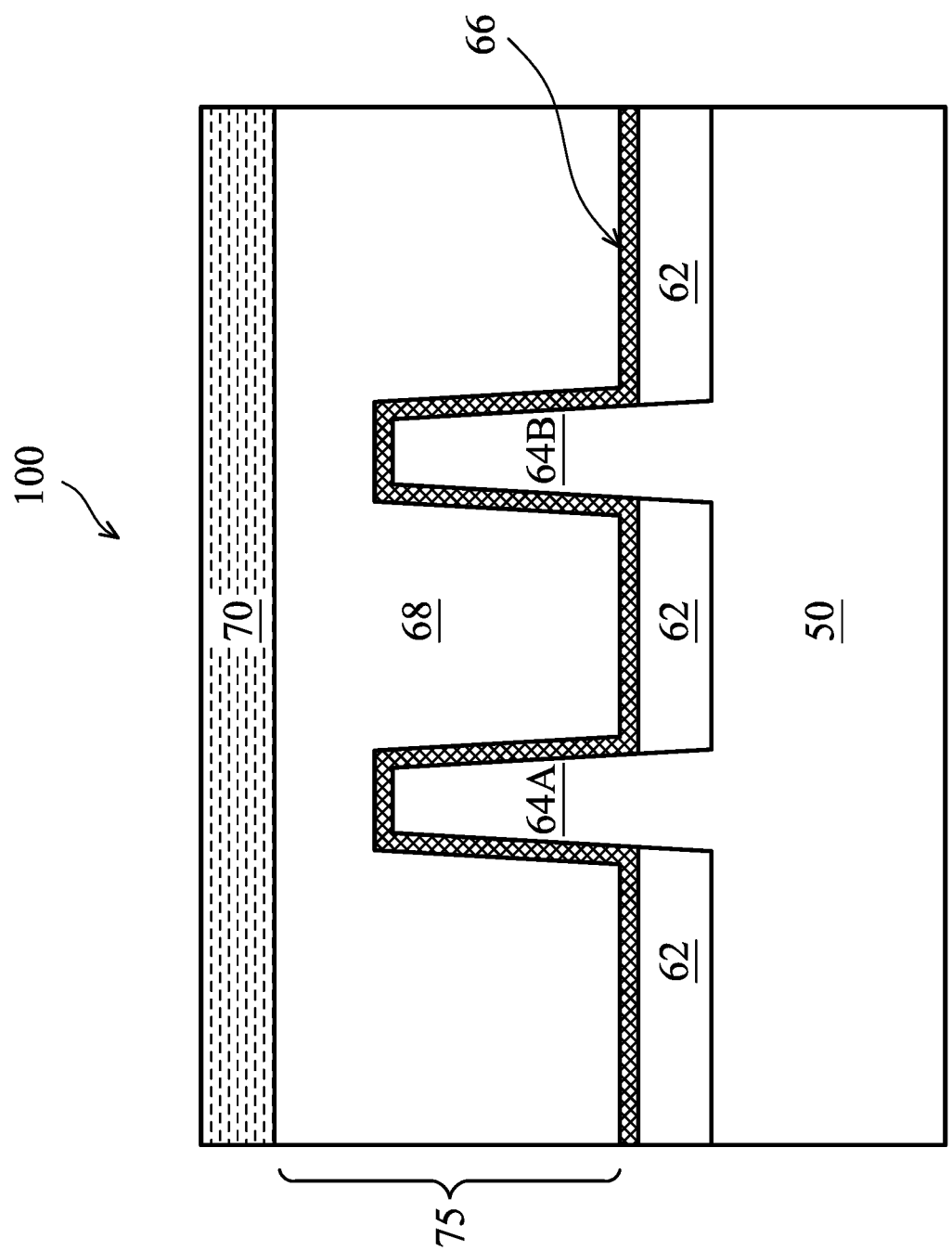

FIG. 5 illustrates the formation of dummy gate structure 75 over the semiconductor fins 64. Dummy gate structure 75 includes gate dielectric 66 and gate 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6 and 7A illustrate the cross-sectional views of further processing of the FinFET device 100 along cross-section A-A (along a longitudinal axis of the fin 64). Note that in FIGS. 6 and 7A, three dummy gate structures 75A, 75B, and 75C are formed over the fin 64. One skilled in the art will appreciate that more or less than three gate structures may be formed over the fin 64, these and other variations are fully intended to be included within the scope of the present disclosure.

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64A to form the LDD regions 65 for a P-type device, and N-type impurities, such as phosphorus, may be implanted in the fin 64B to form the LDD regions 65 for an N-type device. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after first gate spacers 72 are formed.

Still referring to FIG. 6, after the LDD regions 65 are formed, a gate spacer 87 is formed on the gate structure. The gate spacer 87 may include a first gate spacer 72 and a second gate spacer 86. In the example of FIG. 6, the first gate spacer 72 is formed on opposing sidewalls of the gate 68 and on opposing sidewalls of the gate dielectric 66. The second gate spacer 86 is formed on the first gate spacer 72, as illustrated in FIG. 6. The first gate spacer 72 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The second gate spacer 86 may be formed of silicon nitride, SiCN, a combination thereof, or the like using a suitable deposition method.

In an exemplary embodiment, the gate spacer 87 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the gate structures. The second portion of the second gate spacer layer remaining after the anisotropic etch process forms the second gate spacer 86. The anisotropic etch process also removes a portion of the first gate spacer layer disposed outside of the sidewalls of the second gate spacer 86, and the remaining portion of the first gate spacer layer forms the first gate spacer 72.

The shapes and formation methods of the first gate spacer 72 and the second gate spacer 86 as illustrated in FIG. 6 are merely non-limiting examples, and other shapes and formation methods are possible. These and other variations are fully intended to be included within the scope of the present disclosure.

Next, as illustrated in FIG. 7A, the source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80 (see FIG. 7C). In some embodiments, the source/drain regions 80 for adjacent fins 64 do not merge together and remain separate source/drain regions 80 (see FIG. 7D). In some embodiments, the resulting FinFET is an n-type FinFET, and source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about 1E19 cm-3 to about 1E21 cm-3. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

As illustrated in FIG. 7A, a first interlayer dielectric (ILD) 90 is formed over the source/drain regions 80, the fins 64, and the dummy gate structures 75 (e.g., 75A, 75B, and 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70, and to planarize the top surface of the first ILD 90 such that the top surface of the first ILD 90 is level with the top surface of the gate 68.

FIG. 7B illustrates the cross-sectional view of the FinFET device 100 shown in FIG. 7A, but along cross-section B-B. As illustrated in FIG. 7B, the gate 68 is disposed over the fin 64A and the fin 64B, and extends continuously from the fin 64A to the fin 64B. The gate spacers 87 are formed between the gate 68 and the first ILD 90. An embodiment gate-last process (sometimes referred to as replacement gate process) is performed subsequently to replace the gate 68 and the gate dielectric 66 with an active gate (may also be referred to as a replacement gate or a metal gate) and active gate dielectric material(s). The active gate may be a metal gate, in some embodiments. Therefore, the gate 68 and the gate dielectric 66 are considered dummy gate structures in a gate-last process.

FIG. 7C illustrates a cross-sectional view of the FinFET device 100 shown in FIG. 7A, but along cross-section C-C, in accordance with an embodiment. In the example of FIG. 7C, the source/drain regions 80A over the fin 64A merge with the source/drain regions 80B over the fin 64B to form a continuous source/drain region 80 over the fins 64A and 64B. FIG. 7C also illustrates spacers 87' on opposing sidewalls of the source/drain regions 80A/80B, which spacers 87' may have a same or similar structure as spacers 87 (see FIG. 7A) and may be formed in a same processing step with the spacers 87.

FIG. 7D illustrates a cross-sectional view of the FinFET device 100 shown in FIG. 7A, but along cross-section C-C, in accordance with another embodiment. In the example of FIG. 7D, the source/drain regions 80A over the fin 64A are separate from, thus do not merge with, the source/drain regions 80B over the fin 64B. FIG. 7D also illustrates spacers 87' on opposing sidewalls of the source/drain regions 80A/80B, which spacers 87' may have a same or similar structure as spacers 87 (see FIG. 7A) and may be formed in a same processing step with the spacers 87.

Figure 8:
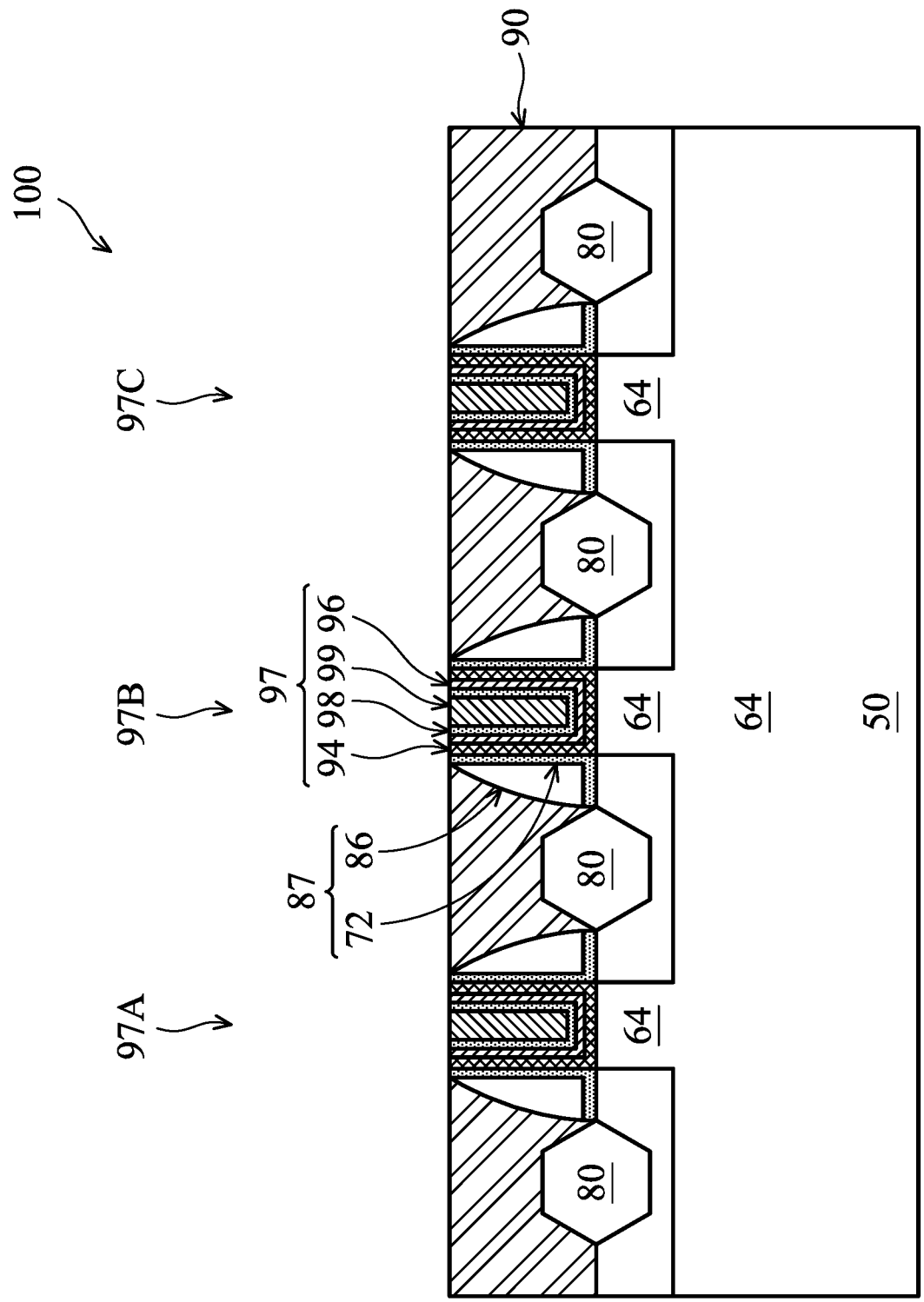

FIGS. 8-15 illustrate cross-sectional views of the FinFET device 100 along cross-section A-A during further processing, in accordance with some embodiments. Referring to FIG. 8, the dummy gate structures 75A, 75B, and 75C are replaced by active gate structures 97A, 97B, and 97C, respectively. In accordance with some embodiments, to form the active gate structures 97 (e.g., 97A, 97B, or 97C), the gate 68 and the gate dielectric 66 directly under the gate 68 are removed in an etching step(s), so that recesses (not shown) are formed between the spacers 87. Each recess exposes a channel region of a respective fin 64. During the dummy gate removal, the dummy gate dielectric layer 66 may be used as an etch stop layer when the dummy gate 68 is etched. The dummy gate dielectric layer 66 may then be removed after the removal of the dummy gate 68.

Next, a gate dielectric layer 94, a barrier layer 96, a seed layer 98, and a gate electrode 99 are formed in the recesses for the replacement gates 97. The gate dielectric layer 94 is deposited conformally in the recesses, such as on the top surfaces and the sidewalls of the fins 64 and on sidewalls of the first gate spacers 72, and on a top surface of the first ILD 90 (not shown). In accordance with some embodiments, the gate dielectric layer 96 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Although not illustrated in FIG. 8, work function layers such as P-type work function layer or N-type work function layer may be formed in the recesses over the barrier layers 96 and before the seed layer 98 is formed, in some embodiments. Exemplary p-type, work function metals that may be included in the gate structures include TiN, TaN, Ru, Mo, Al, WN, $ZrSi_2$, $MoSi_2$, $NiSi_2$, WN, other suitable p-type work function materials, or combinations thereof. Exemplary n-type work function metals that may be included in the gate structures include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, the seed layer 98 is formed conformally over the barrier layer 96. The seed layer 89 may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer 98 comprises a titanium layer and a copper layer over the titanium layer.

Next, the gate electrode 99 is deposited over the seed layer 98, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer (if formed), the seed layer 98, and the gate electrode 99, which excess portions are over the top surface of the first ILD 90. The resulting remaining portions of the gate dielectric layer 94, the barrier layer 96, the work function layer (if formed), the seed layer 98, and the gate electrode 99 thus form the replacement gates 97 of the resulting FinFET device 100.

Figure 9:
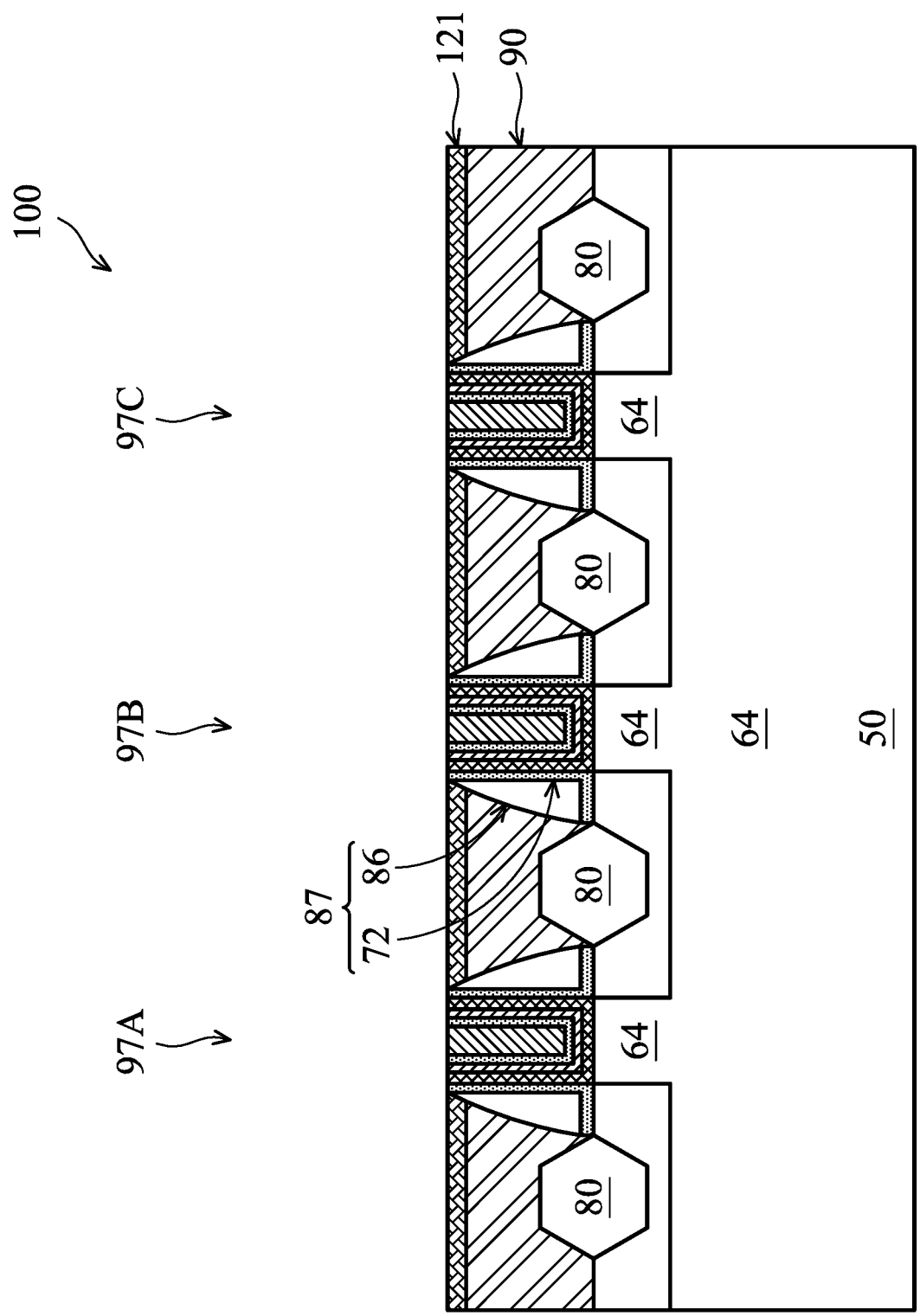
Figure 10:
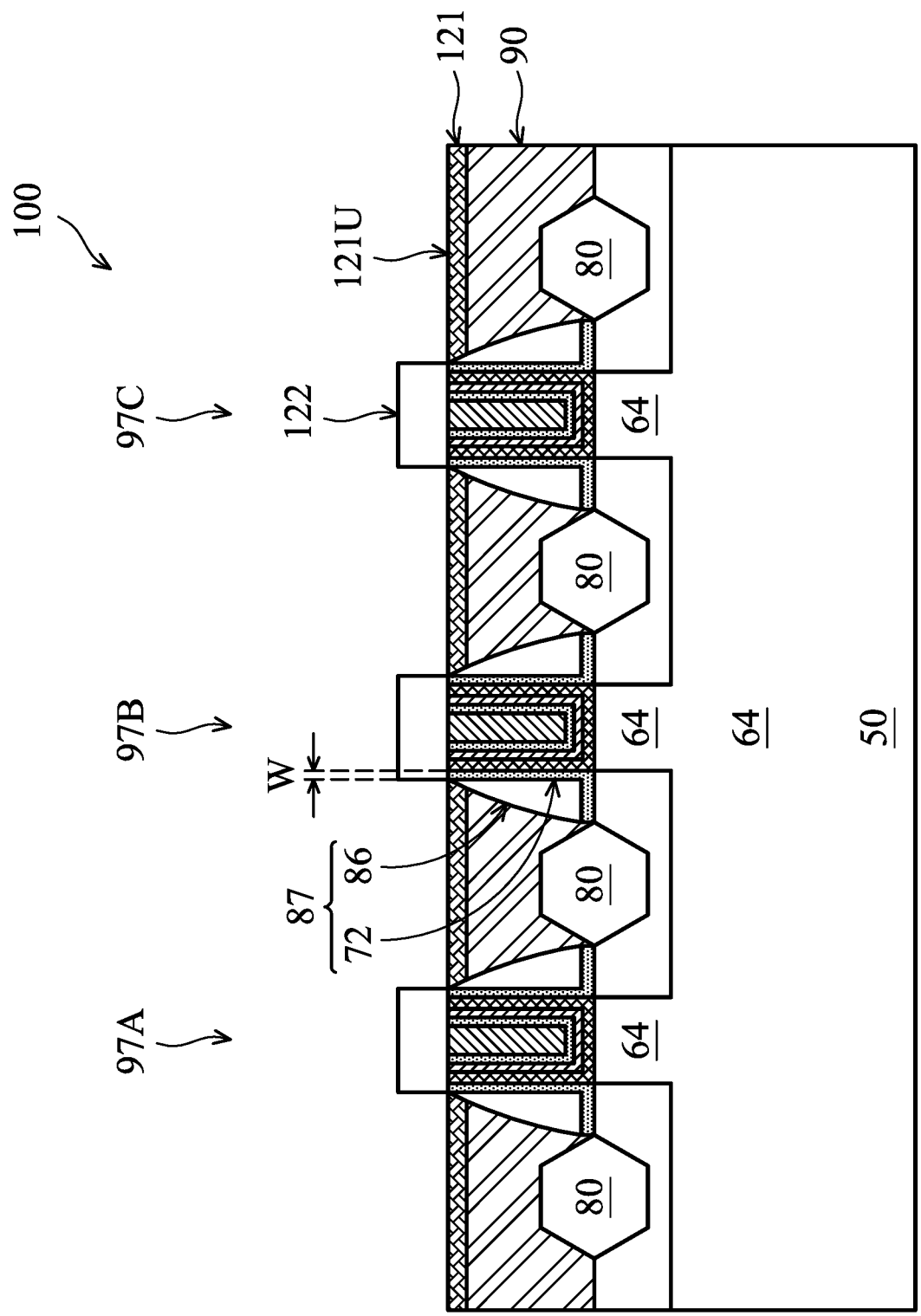
Figure 11:
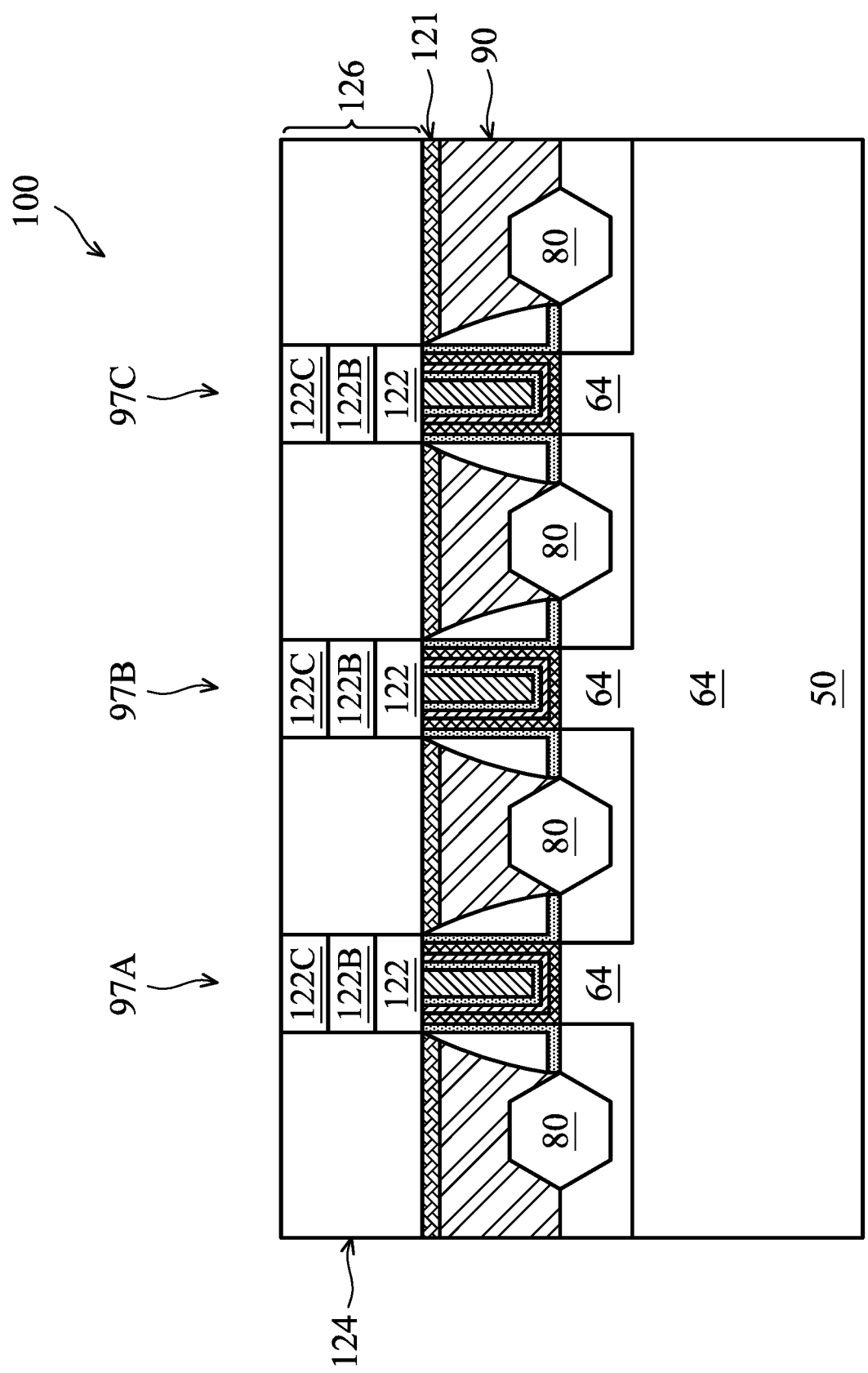

FIGS. 9-11 illustrates further processing steps to form a mask structure 126 (see FIG. 11) over the replacement gates 97 and the first ILD 90, in some embodiments. In FIG. 9, a surface treated layer 121, which is a dielectric layer, is selectively formed over the upper surface of the first ILD 90. Therefore, the surface treated layer 121 covers the upper surface of the first ILD 90 while leaving the upper surface of the replacement gates 97 and the upper surface of the spacers 87 exposed. In some embodiments, the surface treated layer 121 is formed by an in-situ HF vapor cleaning process. In an exemplary HF vapor cleaning process, a wafer having the FinFET device 100 is placed in a deposition chamber with a vacuum maintained at about 1 torr. The deposition chamber is filled with a high purity nitrogen (e.g., with oxygen and moisture concentration of less than 1 ppm). Vapors, such as azeotropic $HF/H_2O$, azeotropic $HCl/H_2O$, $H_2O$, and high purity isopropyl alcohol (IPA) are then introduced into the deposition chamber and transported to the surface of the wafer (e.g., comprising the FinFET device 100) using a carrier gas such as $N_2$. The vapors react with and convert the upper portion of the ILD 90 into the surface treated layer 121. The pressure in the deposition chamber rises after the vapors are introduced into the deposition chamber. In the illustrated embodiment, the surface treated layer 121 comprises a same material, such as silicon oxide (e.g., $SiO_2$), as the ILD 90.

In accordance with some embodiments, during formation of the surface treated layer 121 (e.g., the HF vapor cleaning process), a flow rate of HF vapor is in a range between about 500 standard cubic centimeters per minute (sccm) and about 2000 sccm, and a flow rate of IPA is in a range between about 500 sccm and about 1000 sccm. Carrier gas, such as nitrogen, helium, argon, the like, or combinations thereof, may be used to carry the precursors into the deposition chamber. The temperature of the formation process of the surface treated layer 121 may be between about 10° C. and about 50° C., and the pressure of the formation process may be between about 50 torr and about 400 torr. A thickness of the surface treated layer 121 formed may be in a range between about 5 angstroms to about 10 angstroms, although other dimensions are also possible. The surface of the surface treated layer 121 may comprise SiOF in addition to $SiO_2$, in some embodiments.

Next, in FIG. 10, a capping layer 122 is formed (e.g., selectively formed) over the upper surface of the replacement gates 97 and the upper surface of the spacers 87, using a suitable deposition method such as LPCVD, ALD, or the like. The capping layer 122 is formed of a material (e.g., a dielectric material) that provides etching selectivity between the capping layer 122 and the first ILD 90. In an exemplary embodiment, the first ILD 90 is formed of silicon oxide, and the capping layer 122 is formed of silicon nitride. Other suitable materials, such as silicon carbide, silicon oxynitride, or silicon carbonitride, may also be used for the capping layer 122. In some embodiments, the capping layer 122 comprises silicon nitride and is formed by a LPCVD process using precursors including silane ($SiH_4$) and ammonia ($NH_3$).

In some embodiments, the capping layer 122 is formed by supplying precursors comprising dichlorosilane ($H_2SiCl_2$) and ammonia ($NH_3$) to the deposition chamber the FinFET device 100 is in. A flow rate of the $H_2SiCl_2$ may be between about 50 sccm and about 500 sccm, and a flow rate of the $NH_3$ may be between about 50 sccm and about 500 sccm. A temperature of the deposition process may be in a range between about 500° C. and about 700° C., and a pressure of the deposition process may be in a range between about 5 mTorr and about 100 mTorr, such as 10 mTorr. After the deposition process, the capping layer 122 comprising silicon nitride is formed, and may have a thickness between about 5 nm and about 10 nm, although other dimensions are also possible.

In some embodiments, the deposition rate of the capping layer 122 over the surface treated layer 121 is almost zero as compared with the deposition rate of the capping layer 122 over the replacement gate 97 and over the spacers 87. In some embodiments, the HF vapor cleaning process suppresses (e.g., reduces) the density of nucleation sites on the surface of the surface treated layer 121 (e.g., $SiO_2$). In particular, the HF vapor cleaning process may reduce contamination and dangling bonds on the surface of the surface treated layer 121 (e.g., $SiO_2$), thus decreasing the number of nucleation sites that can host silicon nitride growth. As a result, little or no capping layer 122 is formed over the surface treated layer 121. In some embodiments, a thickness of the capping layer 122 over the replacement gate 97 (or over the spacers 87) is in a range between about 2 nm to about 10 nm, and there is little or no capping layer 122 formed over the surface treated layer 121 after the deposition process of the capping layer 122.

In some embodiments, the upper surface of the spacer 87 that is level with (e.g., exposed by) the upper surface 121U of the surface treated layer 121 has a width W between about 1 nm and about 2.5 nm, and is covered by the capping layer 122. In other words, the capping layer 122 extends laterally beyond sidewalls of the replacement gate 97 by about 1 nm and about 2.5 nm to cover the upper surface of the spacer 87. Note that the processing steps illustrated in FIGS. 9 and 10 result in the capping layer 122 being formed over the replacement gates 97 and over the spacers 87, but not over the first ILD 90. For this reason, the processing shown in FIGS. 9 and 10 may be collectively referred to as selectively forming the capping layer 122 over the replacement gates 97 and over the spacers 87.

Next, as illustrated in FIG. 11, processing similar to those shown in FIG. 10 is repeated one or more times, to selectively form additional capping layers (e.g., 122B and 122C) over the previously formed capping layer 122. For example, after the processing of FIG. 10, another surface treated layer 121 may be selectively formed to cover the upper surface of the surface treated layer 121 formed previously while exposing the upper surface of the capping layer 122. Next, a capping layer 122B may be selectively formed over the capping layer 122. The above described processing can be repeated to form another capping layer 122C, or additional capping layer(s) over 122C, until a total thickness of the capping layers, e.g., 122, 122B, 122C, reaches or exceeds a pre-determined thickness, such as about 100 angstroms or about 200 angstroms. For example, four capping layers may be selectively formed to reach a total thickness of about 150 angstroms. In another embodiment, after the processing of FIG. 10, additional capping layers, such as 122B and 122C, are selectively and successively formed over the capping layer 122 without forming additional surface treated layer 121.

The capping layers, e.g., 122, 122B, and 122C, are formed of a same material, in the illustrated example of FIG. 11, although different materials may be used for the capping layers. Although FIG. 11 illustrates three capping layer 122/122B/122C being formed over the replacement gates 97 (and over the spacer 87), more or less than three capping layers may be formed. These and other variations are fully intended to be included within the scope of the present disclosure.

During formation of the capping layers (e.g., 122/122B/122C), the capping layers may have lateral growth (e.g., growth along a direction parallel to the upper surface of the first ILD 90). Therefore, a single capping layer with a thickness equal to the sum of the capping layers such as 122/122B/122C in FIG. 11 may be deformed due to the lateral growth which may result in performance degradation or device failure. In contrast, by forming multiple capping layers, each of which having a relatively small (e.g., about 50 angstroms) thickness, good control of the lateral growth and profile of each of the capping layers is achieved, in some embodiments. As a result, the stack of capping layers (e.g., 122, 122B, and 122C) formed have a well controlled profile, which improves the yield and/or performance of the semiconductor device formed. In some embodiments, the sidewalls of the capping layers in FIG. 11, e.g., 122/122B/122C, are substantially aligned with each other and are within 1.5 nm of each other. In other words, the largest lateral distance between the corresponding sidewalls of the capping layers are smaller than about 1.5 nm.

After the capping layers (e.g., 122/122B/122C) are formed to reach a pre-determined thickness, a dielectric layer 124 is formed over the first ILD 90, over the surface treated layer 121, and over the capping layers. A planarization process, such as CMP, may be performed to achieve a planar upper surface between the dielectric layer 124 and the uppermost surface of the stack of capping layers (e.g., the upper surface of the capping layer 122C in FIG. 11). The dielectric layer 124 comprises a same material (e.g., silicon oxide) as the first ILD 90, in some embodiments. In other embodiments, the dielectric layer 124 comprises a material having a same or similar etching rate as the first ILD 90, such that in a subsequent etching process, the first ILD 90 and the dielectric layer 124 may be removed at a same or similar rate while the stack of capping layers protect the replacement gates 97 from the etching process. The stack of capping layers (e.g., 122/122B/122C) and the dielectric layer 124 may be collectively referred to as a mask structure 126.

Figure 12:
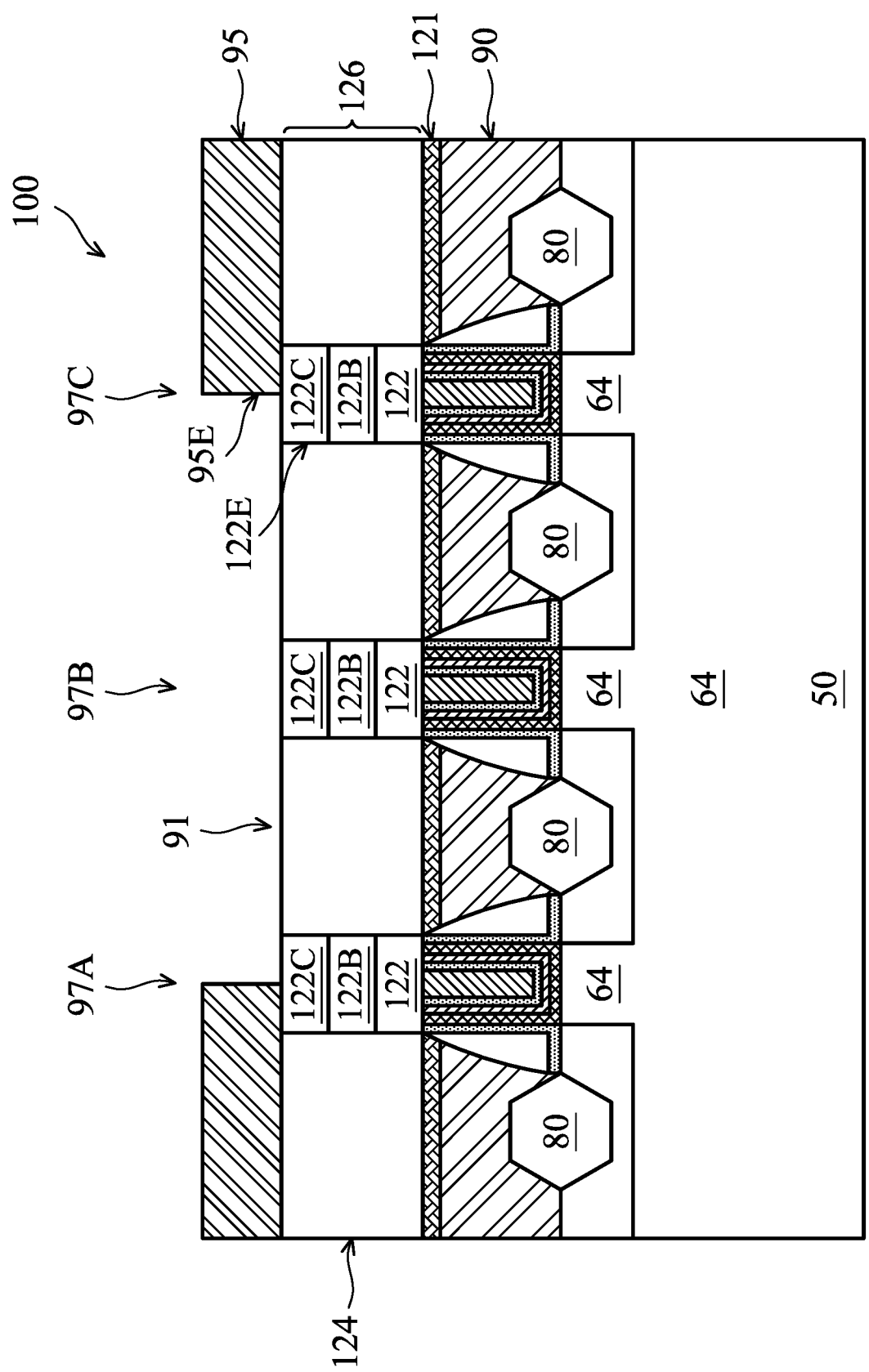

Next, as illustrated in FIG. 12, a patterned mask layer 95 is formed over the mask structure 126. The pattered mask layer 95 may be formed by depositing a mask layer, such as a photo resist, then patterning the photo resist using photolithography and/or etching processes. An opening 91 of the patterned mask layer 95 exposes portions of the dielectric layer 124 disposed between replacement gates 97, e.g., between 97A and 97B and between 97B and 97C. Due to the capping layers 122/122B/122C covering and protecting the replacement gates 97 in a subsequent etching process, the edge 95E of the patterned mask layer 95 in the opening 91 does not have to be aligned with the sidewall 122E of the capping layers, thus allowing for larger error margins for the photolithography process used to form the opening 91.

Figure 13:
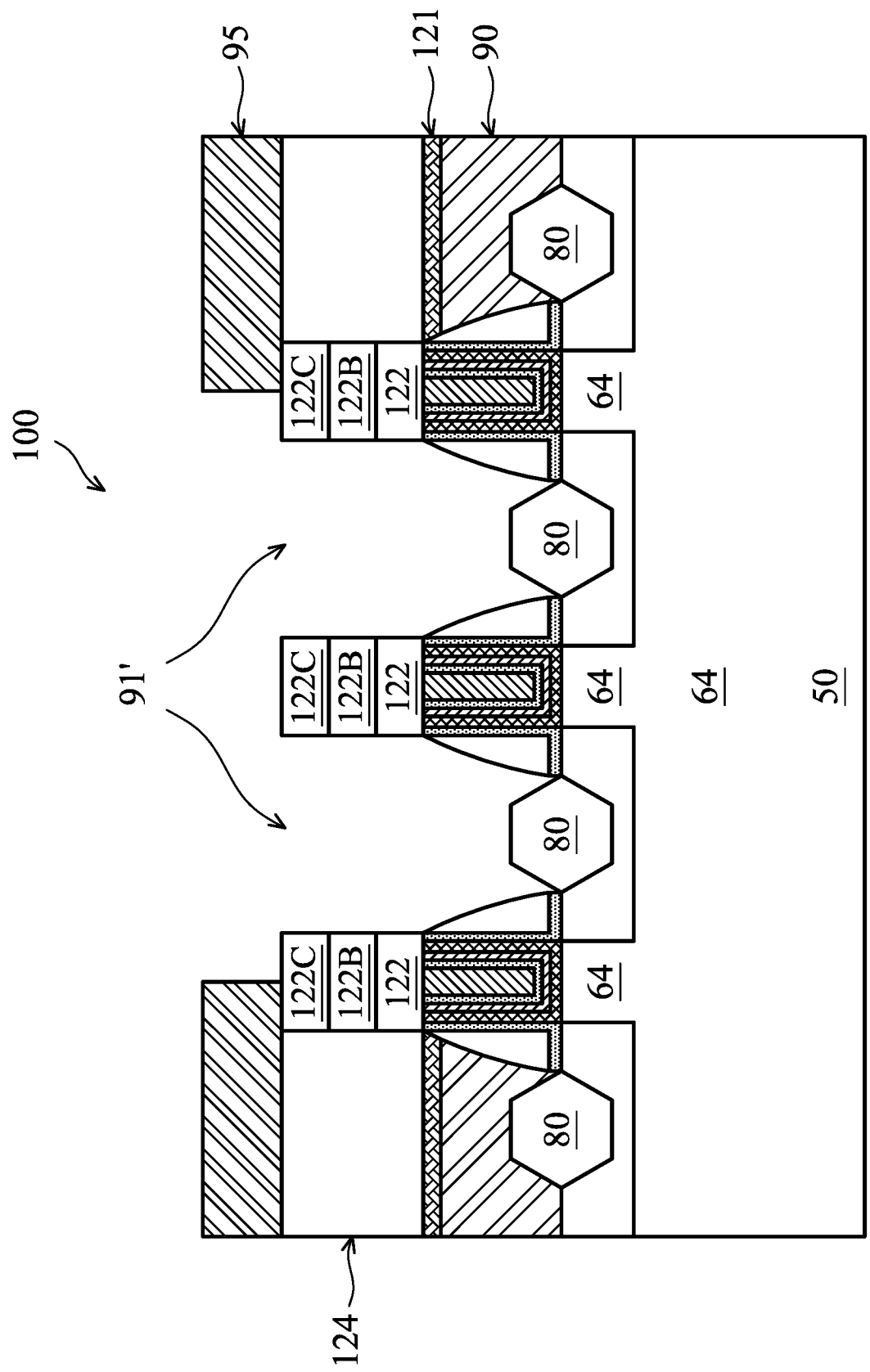

Next, in FIG. 13, an etching process is performed to extend the opening 91 deeper into the FinFET device 100, and as a result, opening 91' is formed that exposes the source/drain regions 80. In some embodiments, the etching process uses an etchant that has an etching selectivity (e.g., having a higher etching rate) for the first ILD 90 and the dielectric layer 124 over the capping layers (e.g., 122/122B/122C) and the spacers 87. For example, a suitable etchant, such as fluorine, tetrafluoromethane ($CF_4$), hexafluoroethane ($C_2F_6$), or sulfur hexafluoride ($SF_6$), may be used to form the opening 91'. In some embodiments, the etchant is a gas comprising hydrofluoric acid (HF), and ammonia ($NH_3$), and may further comprise a carrier gas such as argon (Ar). Due to the etching selectivity, the etchant removes the ILD 90 and the dielectric layer 124 without substantially attacking the capping layers 122/122B/122C and the spacers 87.

Figure 14:
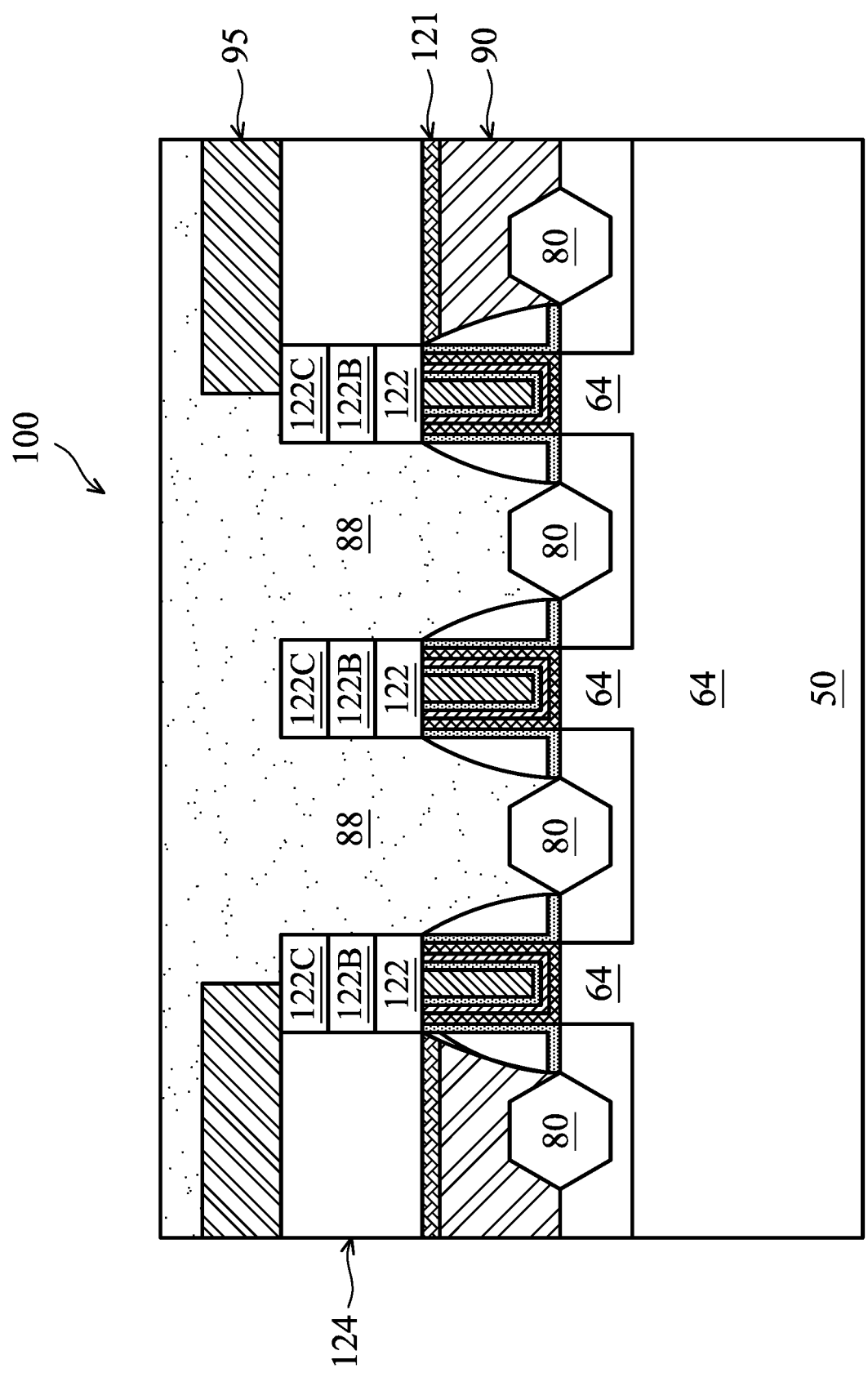

Once the opening 91' is formed, an electrically conductive material 88, such as a metal, is formed to fill the opening 91', as illustrated in FIG. 14. The conductive material 88 may comprise a suitable material such as copper, aluminum, tungsten, cobalt, ruthenium, the like, or combinations thereof, and may be formed by a suitable method such as plating, PVD, CVD, ALD, the like, or combinations thereof. Although not illustrated, a seed layer may be formed before the conductive material 88 is formed, the conductive material 88 may then be plated onto the seed layer to fill the opening 91'. The conductive material 88, after formed, may overfill the opening 91' and cover the upper surface of the patterned mask layer 95.

Figure 15:
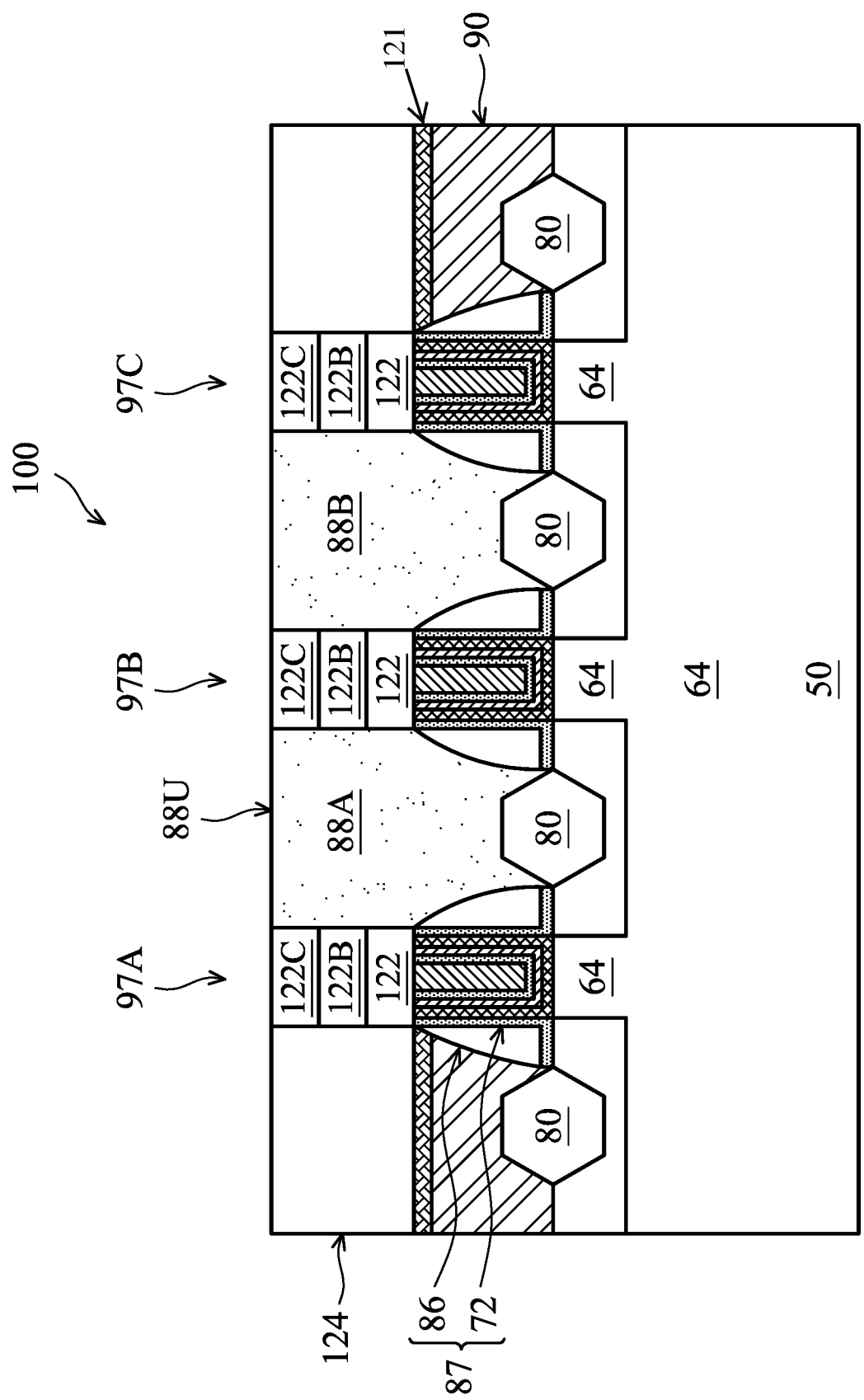
Figure 16:
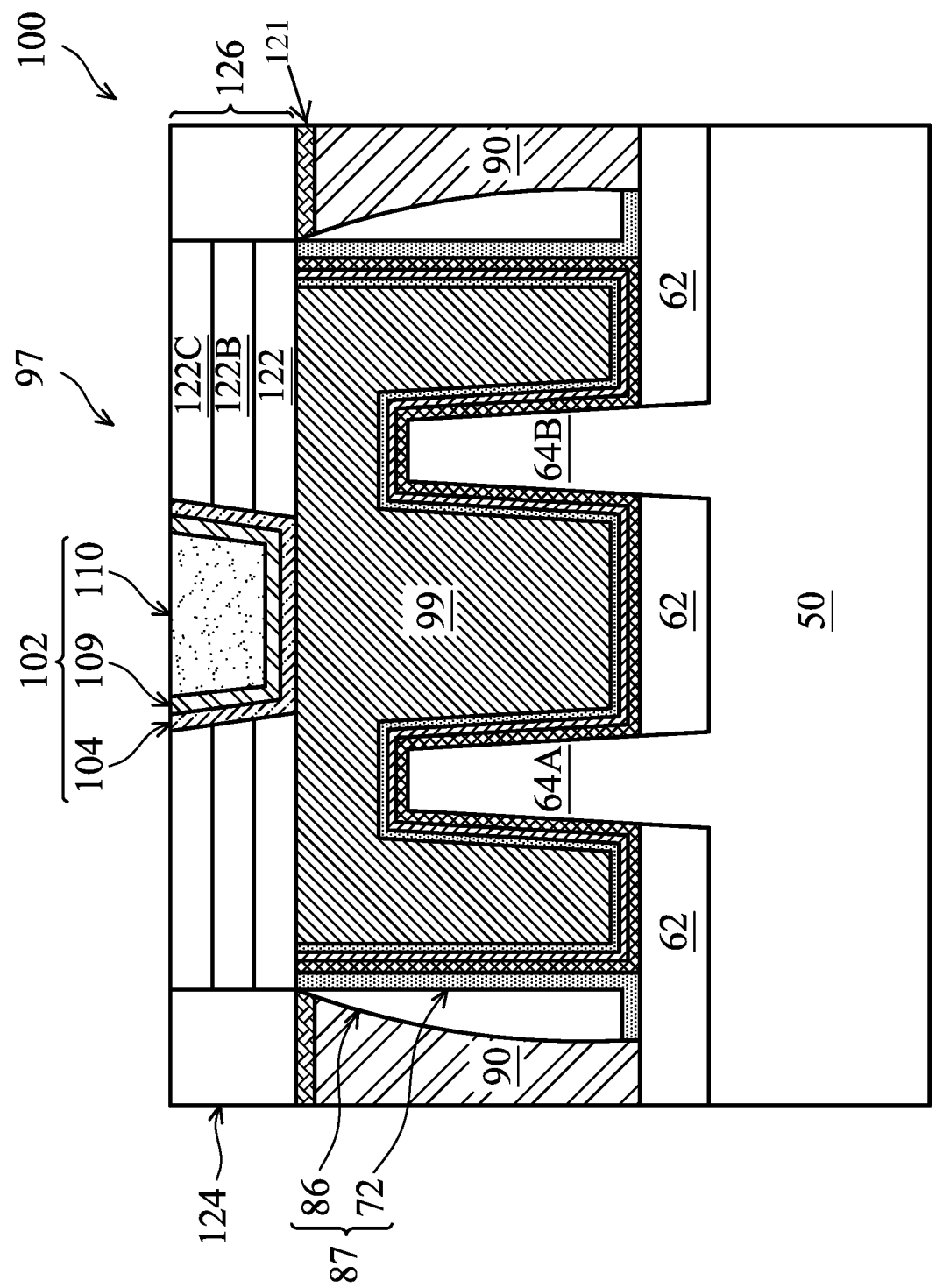

Next, in FIG. 15, a planarization process, such as CMP, is performed to remove upper portions of the conductive material 88 and the patterned mask layer 95. After the planarization process, the uppermost capping layer (e.g., 122C) and the dielectric layer 124 are exposed, and remaining portions of the conductive material 88 form source/drain contact plugs 88A/88B. As illustrated in FIG. 15, the source/drain contact plugs 88A/88B are formed in a self-aligned manner, and each of the source/drain contact plugs, e.g., source/drain contact plug 88A, extends from the spacer 87 on a first sidewall of a replacement gate (e.g., 97A) to the spacer 87 on a second sidewall of an adjacent replacement gate (e.g., 97B) facing the first sidewall. The example of FIG. 15 illustrates the upper surface 88U of the source/drain contact plugs 88A/88B being level with the upper surface of the uppermost capping layer (e.g., 122C). In other embodiments, the CMP process may continue (before stopping) after reaching the upper surface of the uppermost capping layer (e.g., 122C), in which case the upper surface 88U of the source/drain contact plugs 88A/88B may be recessed further toward the substrate 50.

In FIG. 15, no contact plugs are illustrated for the source/drain regions 80 on the leftmost side (see label 80L) and on the rightmost side (see label 80R). Although not illustrated, the contact plugs for the source/drain regions 80L and 80R may be formed by, e.g., a non-self-aligned method, such as by forming openings through the dielectric layer 124 and the first ILD 90 to expose the source/drain regions 80L and 80R, then filling the openings with conductive materials. In some embodiments, no contact plugs are formed for the source/drain regions 80L and 80R, and in which case, the replacement gates 97A and 97C are not functional gates and serve as dummy gates for formation of the self-aligned source/drain contact plugs 88A/88B for the replacement gate 97B.

FIG. 16 illustrates the cross-sectional view of the FinFET device 100 in FIG. 15, but along cross-section B-B. In FIG. 16, gate contact 102 is formed. The gate contact 102 may extend through the stack of capping layers (e.g., 122/122B/122C) to electrically connect to the replacement gate 97. As illustrated, the gate contact 102 includes a barrier layer 104, a seed layer 109, and an electrically conductive material 110, which may be the same or similar to the barrier layer 96, the seed layer 98, and the gate electrode 99 of the replacement gate 97, respectively, thus details are not repeated. Additional layers may be included in the gate contact 102, and the location of the gate contact 102 may be at other suitable locations, e.g., at the left end or the right end of the replacement gate 97 in FIG. 16. These and other variations are fully intended to be included within the scope of the present disclosure.

Figure 17:
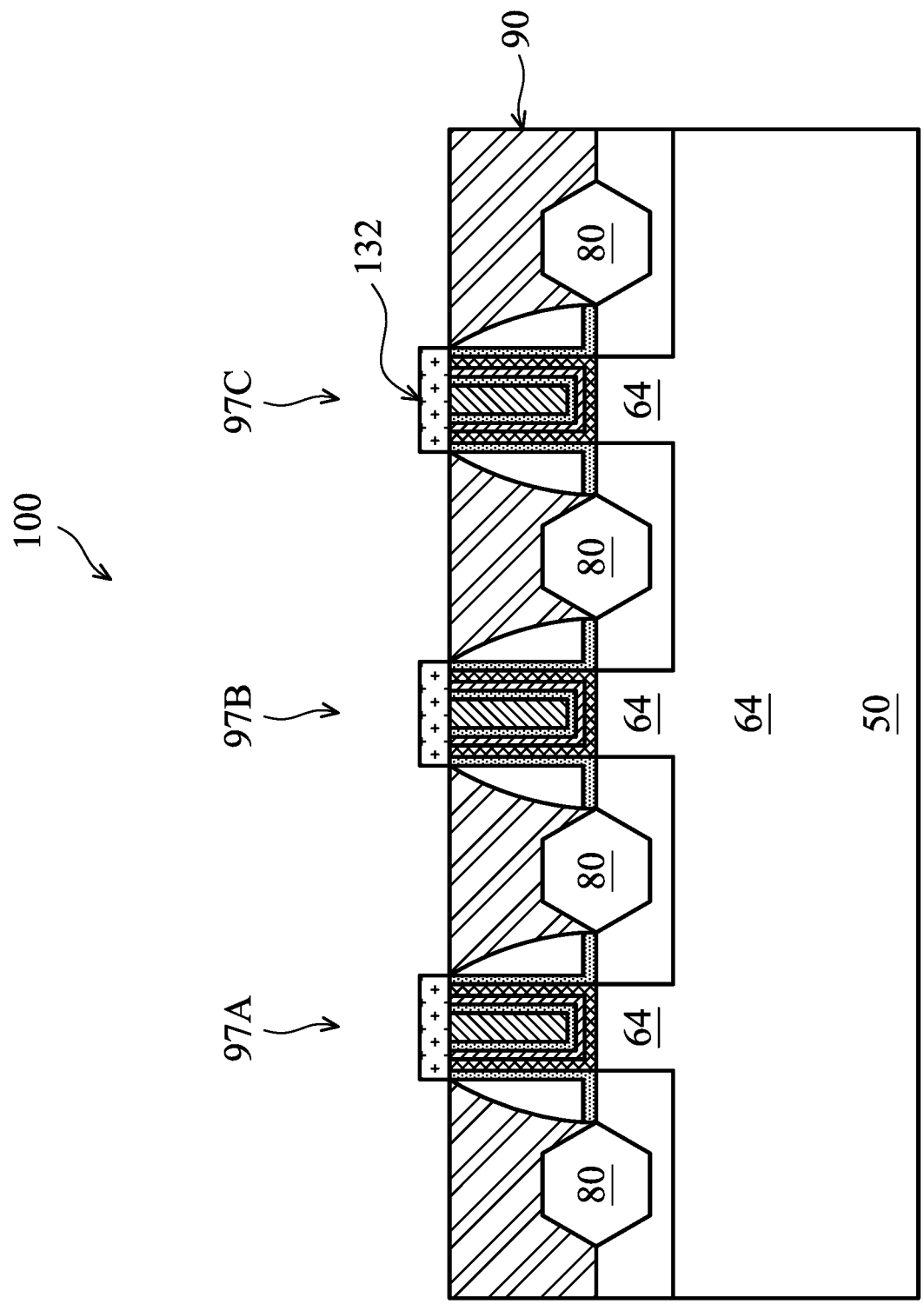
FIGS. 17-26 illustrate cross-sectional views of a FinFET device at various stages of fabrication, in accordance with some embodiments.

FIGS. 2-8, and 17-26 illustrate cross-sectional views of a FinFET device 100 at various stages of processing, in yet another embodiment. Referring to FIG. 17, following the processing illustrated in FIGS. 2-8, a capping layer 132 is selectively formed over the upper surface of the replacement gates 97. The capping layer 132 comprises a metal, such as cobalt (Co) or iron (Fe), which serves as a catalyst for forming carbon nanotubes on the capping layer 132 in subsequent processing, in the illustrated embodiment. In some embodiments, the capping layer 132 has a thickness between about 50 angstroms and about 100 angstroms, and is formed selectively over the replacement gates 97. The capping layer 132 may also be formed over the upper surface of the spacers 87.

In some embodiments, the capping layer 132 is a cobalt layer and is deposited by supplying a precursor comprising bis(1,4-di-tert-butyl-1,3-diazadienyl) cobalt and tert-butylamine to a deposition chamber the FinFET device 100 is in. In some embodiments, a flow rate of the bis(1,4-di-tert-butyl-1,3-diazadienyl) cobalt is between about 20 sccm and about 100 sccm, and a flow rate of the tert-butylamine is between about 50 sccm and about 100 sccm, the temperature of the deposition process is between about 200° C. and about 250° C., and a pressure of the deposition process is between about 10 Torr and about 20 Torr. A duration of the deposition process is between about 70 seconds to about 90 seconds, such as 80 seconds, although other durations may also be used.

Figure 18:
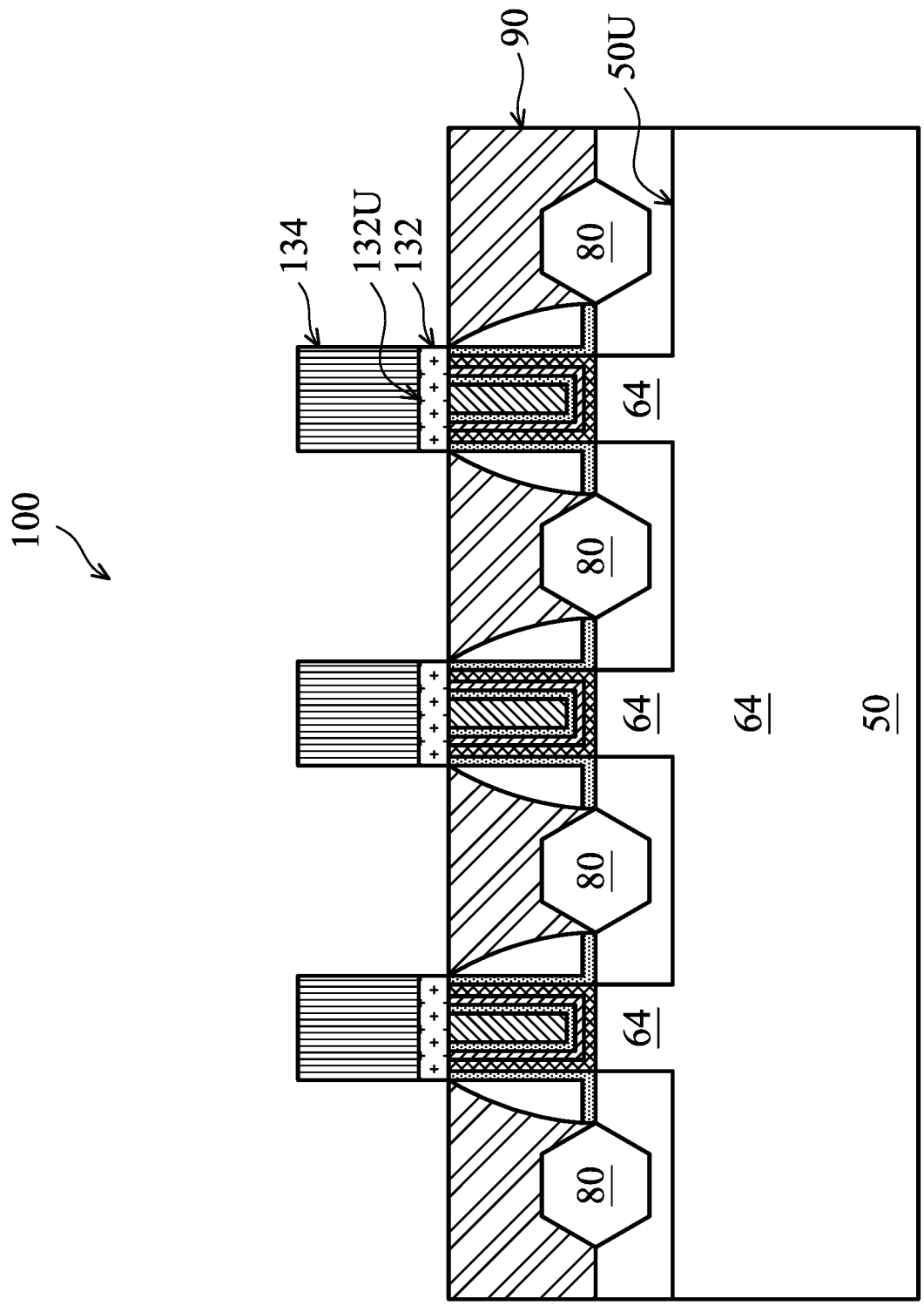

Next, referring to FIG. 18, carbon nanotubes 134 are formed over the capping layer 132. In some embodiments, the carbon nanotubes 134 are formed by suppling a gas comprising carbon, such as acetylene ($C_2H_2$), to the surface of the capping layer 132. A flow rate of the $C_2H_2$ is between about 20 sccm and about 100 sccm, in some embodiments. A temperature of the carbon nanotube growth process is between about 270° C. and about 1000° C., and a pressure of the carbon nanotube growth process is between about 100 mTorr and about 700 mTorr, such as 300 mTorr, in some embodiments. The $C_2H_2$ decomposes under the high temperature to provide carbon for the growth of the carbon nanotubes 134. A chemical equation describing the decomposition of $C_2H_2$ is given below.

$$C_2H_2 \rightarrow 2C + H_2$$

In some embodiments, the capping layer 132 is a cobalt layer or an iron layer, which acts as the catalyst in the growth of the carbo nanotubes 134. In an exemplary embodiment, the carbon nanotubes growth process is performed for about 20 minutes to about 40 minutes, and the carbon nanotubes 134 with a height in a range between about 200 angstrom and about 500 angstroms are formed on the capping layer 132. As illustrated in the example of FIG. 18, the carbon nanotubes 134 are substantially perpendicular to an upper surface 132U of the capping layer 132.

Figure 19:
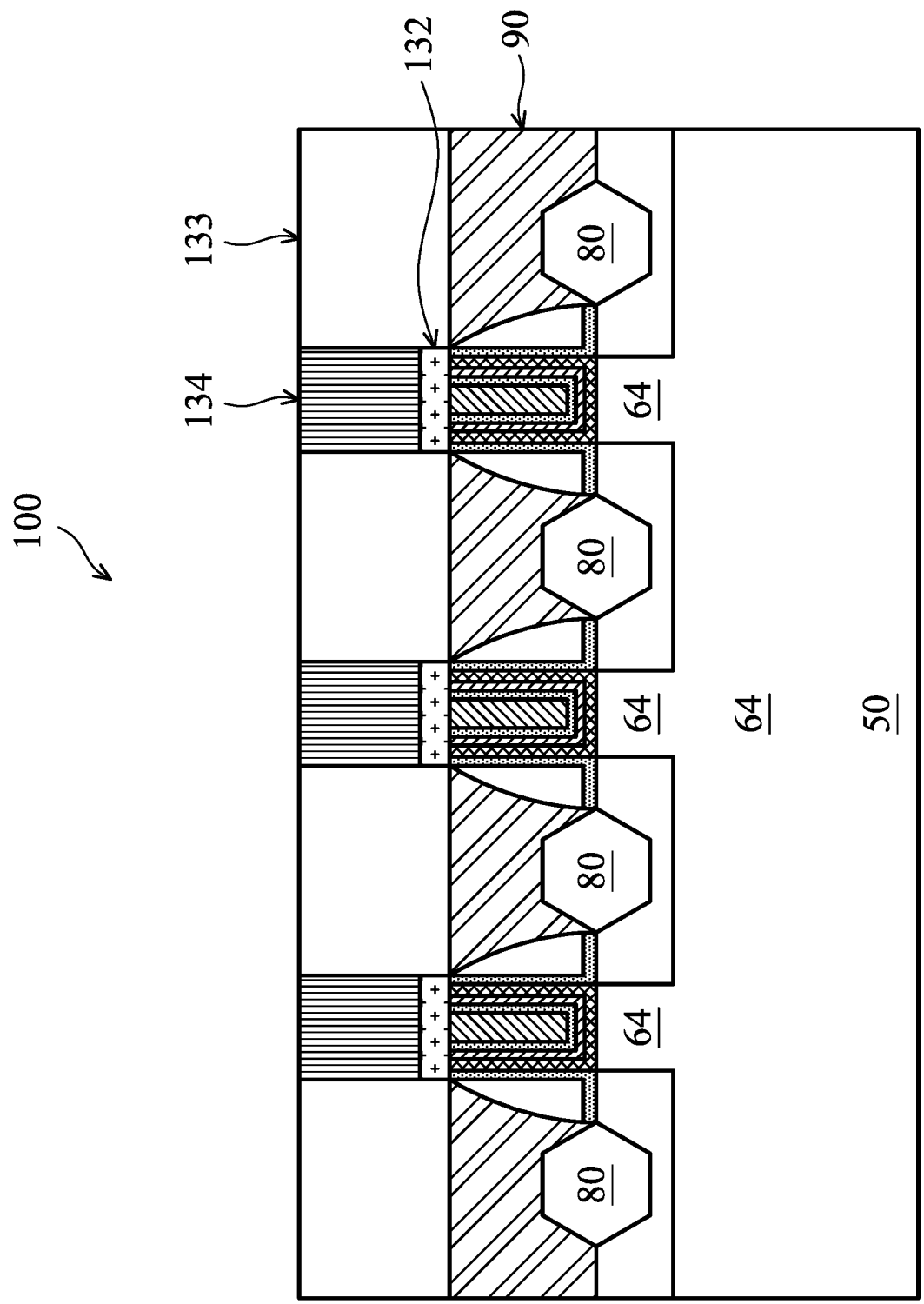

Next, in FIG. 19, a dielectric layer 133 is formed over the first ILD 90 and the carbon nanotubes 134. A planarization process, such as CMP, may be performed to remove top portions of the dielectric layer 133 and/or top portions of the carbon nanotubes 134. In some embodiments, the dielectric layer 133 comprises a same material as the first ILD 90, such as silicon oxide. In other embodiments, the dielectric layer 133 comprises a material having a same or similar etching rate as the first ILD 90, such that in a subsequent etching process, the first ILD 90 and the dielectric layer 133 may be removed at a same or similar rate while a hard mask layer 135 (see FIG. 21) protects the replacement gates 97 from the etching process.

Figure 20:
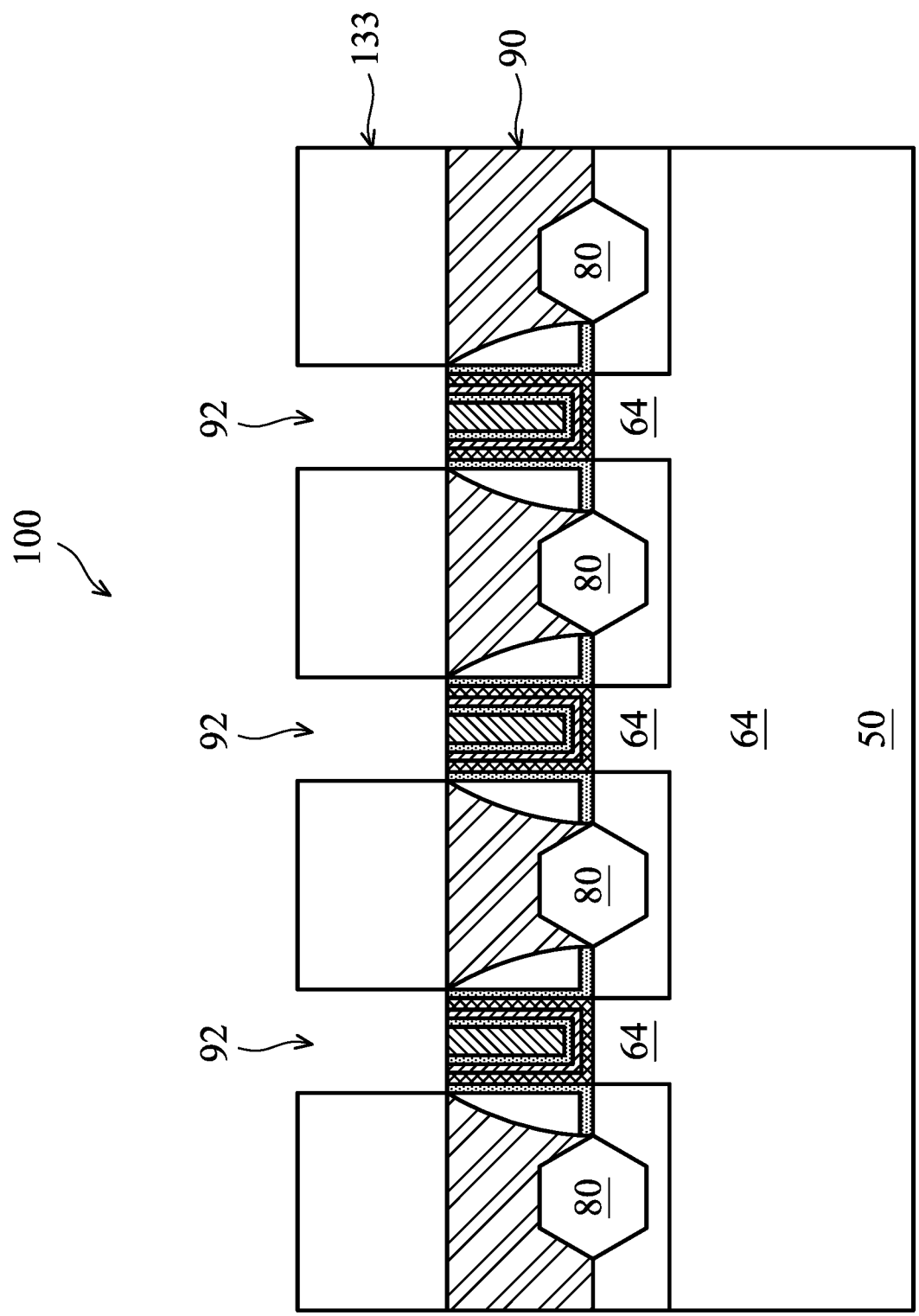

Next, in FIG. 20, the carbon nanotubes 134 and the capping layer 132 are removed to form recesses 92 in the dielectric layer 133, which recesses 92 expose the upper surfaces of the replacement gates 97. In an exemplary embodiment, the removal of the carbon nanotubes 134 and the capping layer 132 comprises a first etching process followed by a second etching process. The first etching process may be a dry etch, such as a plasma process. For example, a plasma process using $O_2$ may be performed to remove the carbon nanotubes 134. After the first etching process, the second etching process, which may be a wet etch using an acid, is performed to remove the capping layer 132, in some embodiments. For example, a wet etch using hydrochloric acid (HCl) may be performed to remove the capping layer 132.

Figure 21:
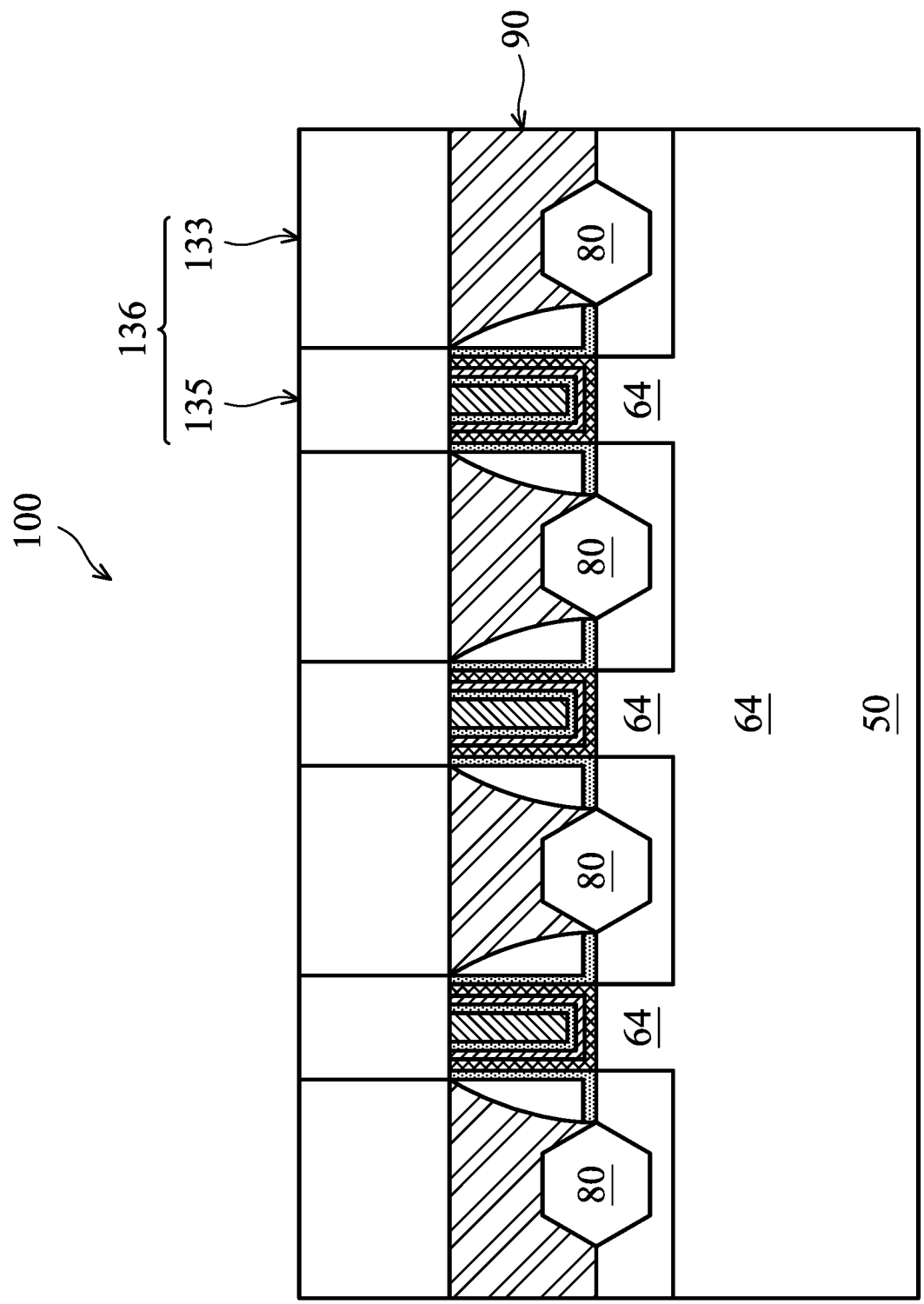

Next, in FIG. 21, a hard mask layer 135 is formed in the recesses 92. The hard mask layer 135 may comprise a suitable material such as silicon nitride, silicon carbide, silicon oxynitride, or silicon carbonitride, and may be formed using any suitable deposition method. The hard mask layer 135 may overfill the recesses 92 and cover the upper surface of the dielectric layer 133. A subsequent planarization process, such as CMP, may be performed to remove excess portions of the hard mask layer 135 disposed over the dielectric layer 133. After the planarization process, the remaining portions of the hard mask layer 135 and the dielectric layer 133 form a mask structure 136, as illustrated in FIG. 21.

Figure 22:
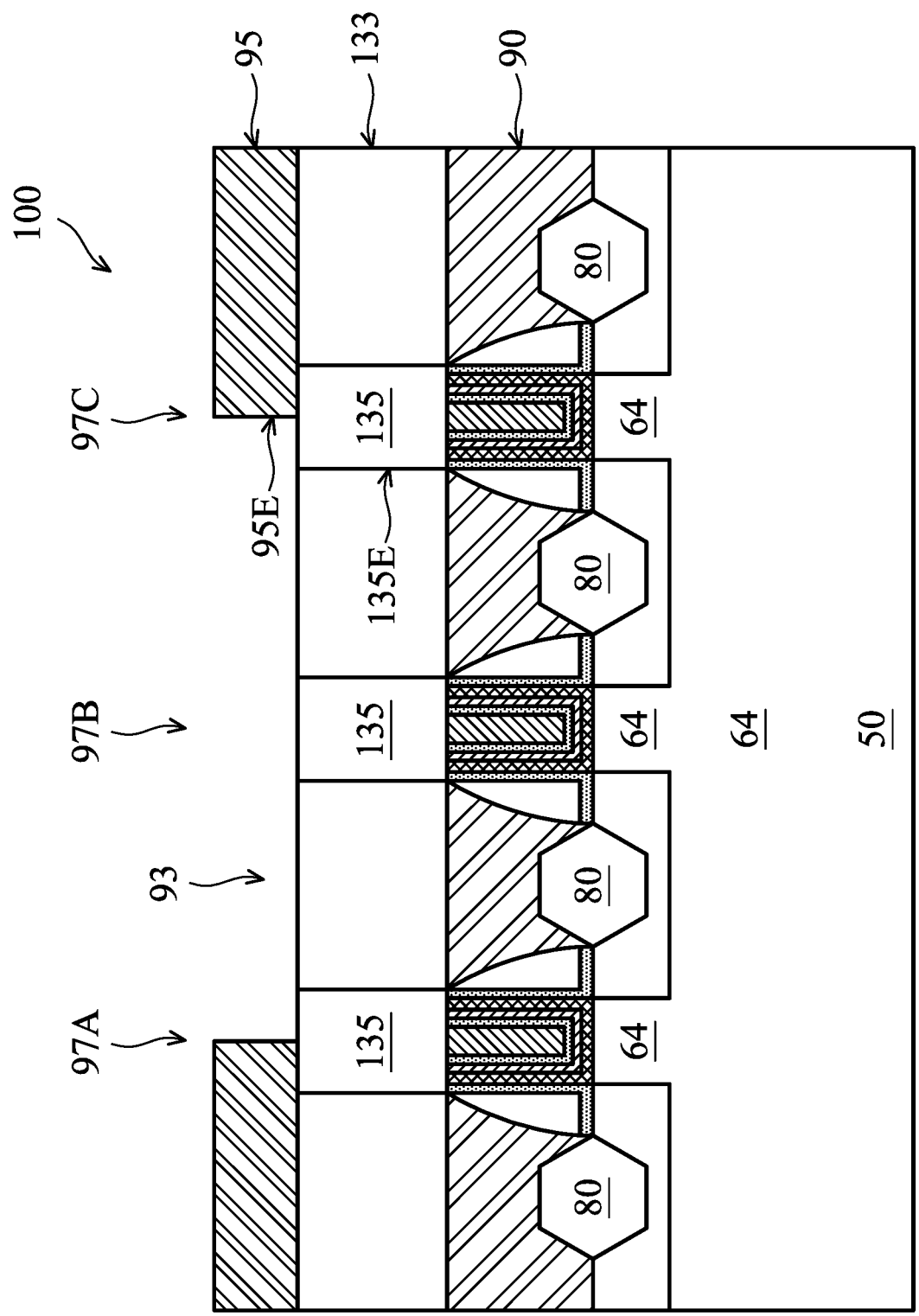

Next, as illustrated in FIG. 22, a patterned mask layer 95 is formed over the mask structure 136. The pattered mask layer 95 may be formed by depositing a mask layer, such as a photo resist, then patterning the photo resist using photolithography and/or etching processes. An opening 93 of the patterned mask layer 95 exposes portions of the dielectric layer 133 disposed between replacement gates 97, e.g., between replacement gates 97A and 97B, and between 97B and 97C. Due to the hard mask layer 135 covering and protecting the replacement gates 97 in a subsequent etching process, the edge 95E of the patterned mask layer 95 in the opening 93 does not have to be aligned with the sidewall 135E of the hard mask layer 135, thus allowing for larger error margins for the photolithography process used in forming the opening 93.

Figure 23:
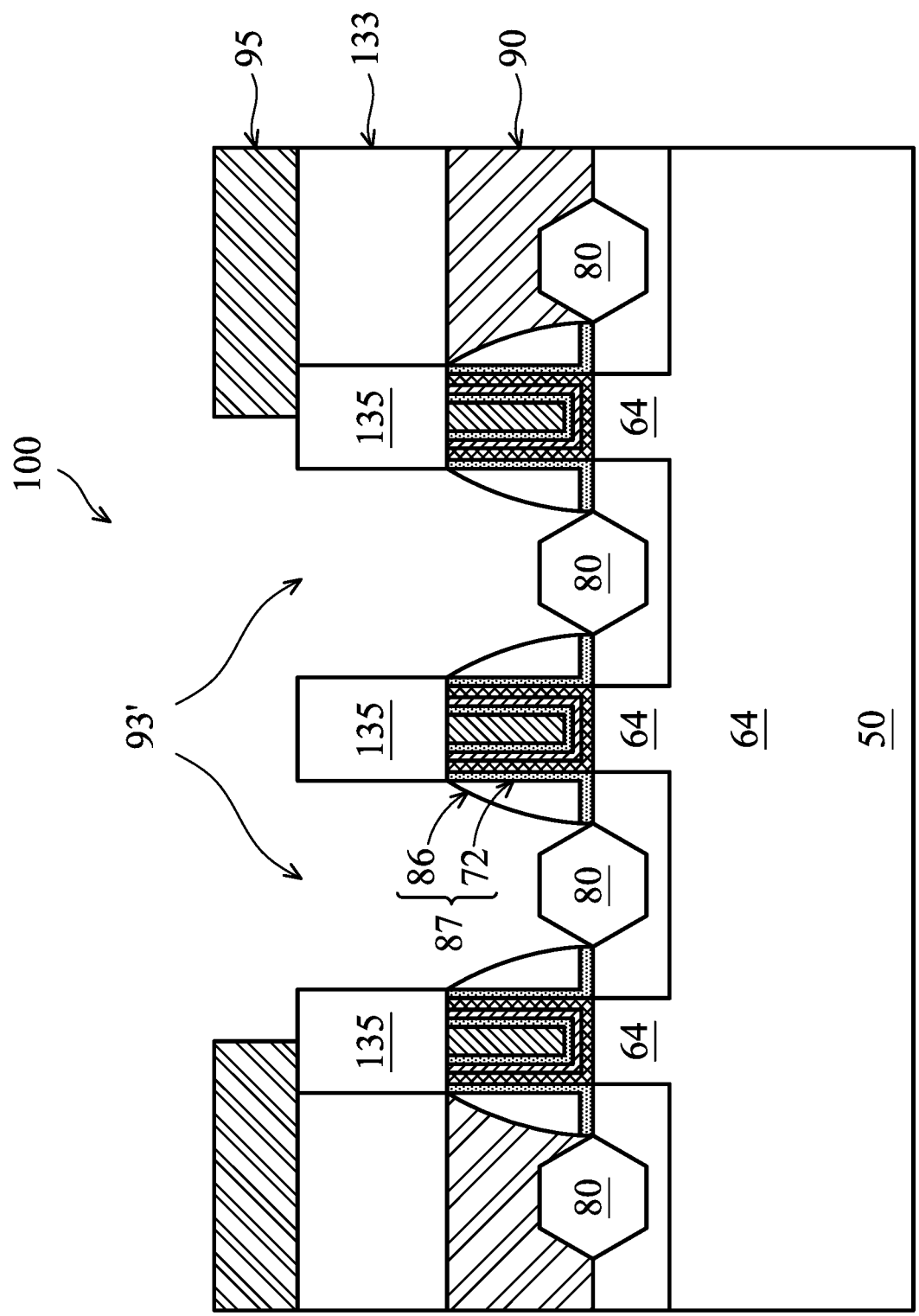

Next, in FIG. 23, an etching process is performed to extend the opening 93 deeper into the FinFET device 100, and as a result, opening 93' is formed that exposes the source/drain regions 80. In some embodiments, the etching process uses an etchant that has an etching selectivity (e.g., having a higher etching rate) for the first ILD 90 and the dielectric layer 133 over the hard mask layer 135 and the spacers 87. For example, a suitable etchant, such as fluorine, tetrafluoromethane ($CF_4$), hexafluoroethane ($C_2F_6$), or sulfur hexafluoride ($SF_6$), may be used to form the opening 93'. In some embodiments, the etchant is a gas comprising hydrofluoric acid (HF) and ammonia ($NH_3$), and may further comprise a carrier gas such as argon (Ar). Due to the etching selectivity, the etchant removes the ILD 90 and the dielectric layer 133 without substantially attacking the hard mask layer 135 and the spacers 87.

Figure 24:
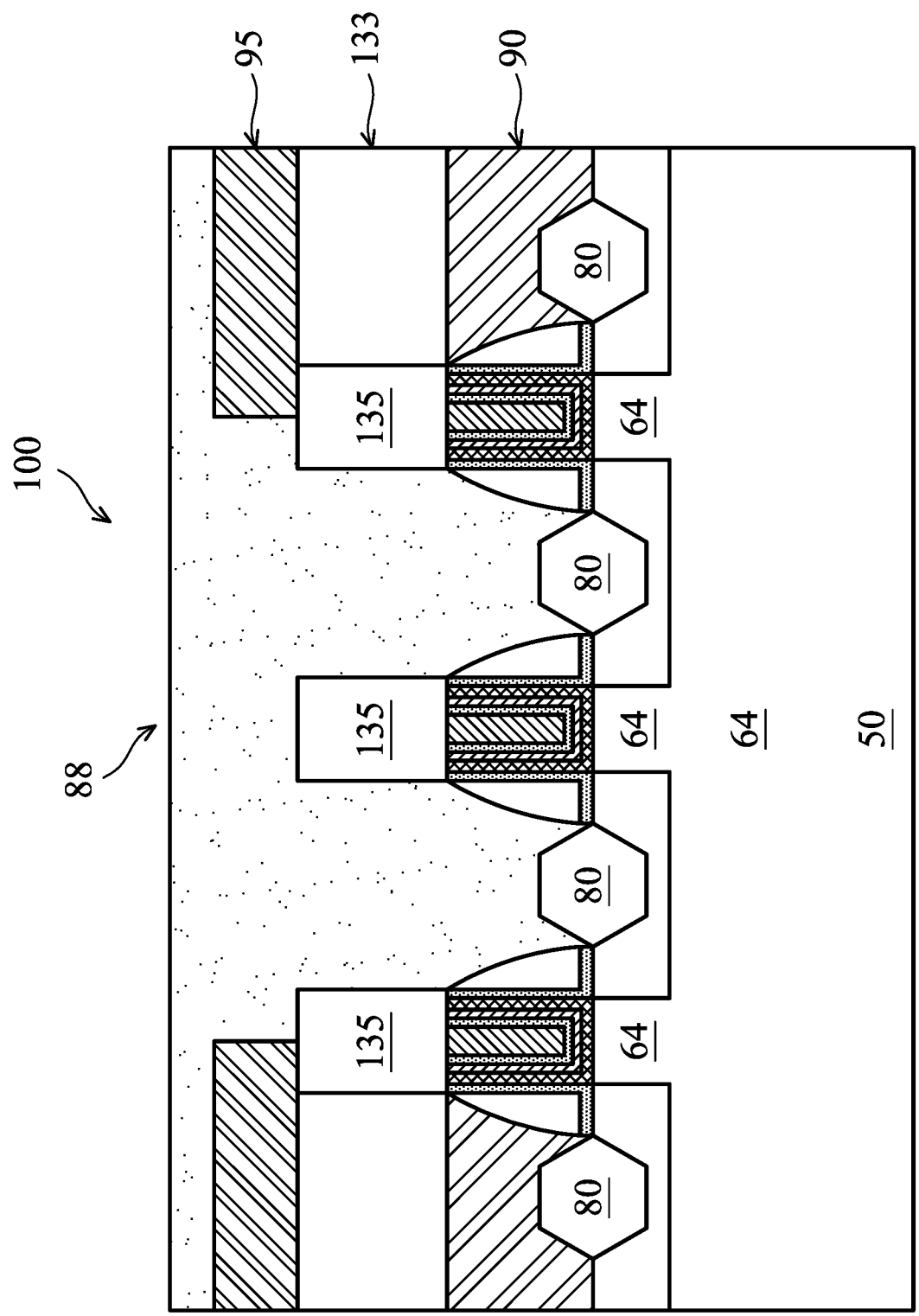

Once the opening 93' is formed, an electrically conductive material 88, such as a metal, is formed to fill the opening 93', as illustrated in FIG. 24. The conductive material 88 may comprise a suitable material such as copper, aluminum, tungsten, cobalt, ruthenium the like, or combinations thereof, and may be formed by a suitable method such as plating, PVD, CVD, ALD, the like, or combinations thereof. Although not illustrated, a seed layer may be formed before the conductive material 88 is formed, the conductive material 88 may then be plated onto the seed layer to fill the opening 93'. The conductive material 88, after formed, may overfill the opening 93' and cover the upper surface of the patterned mask layer 95.

Figure 25:
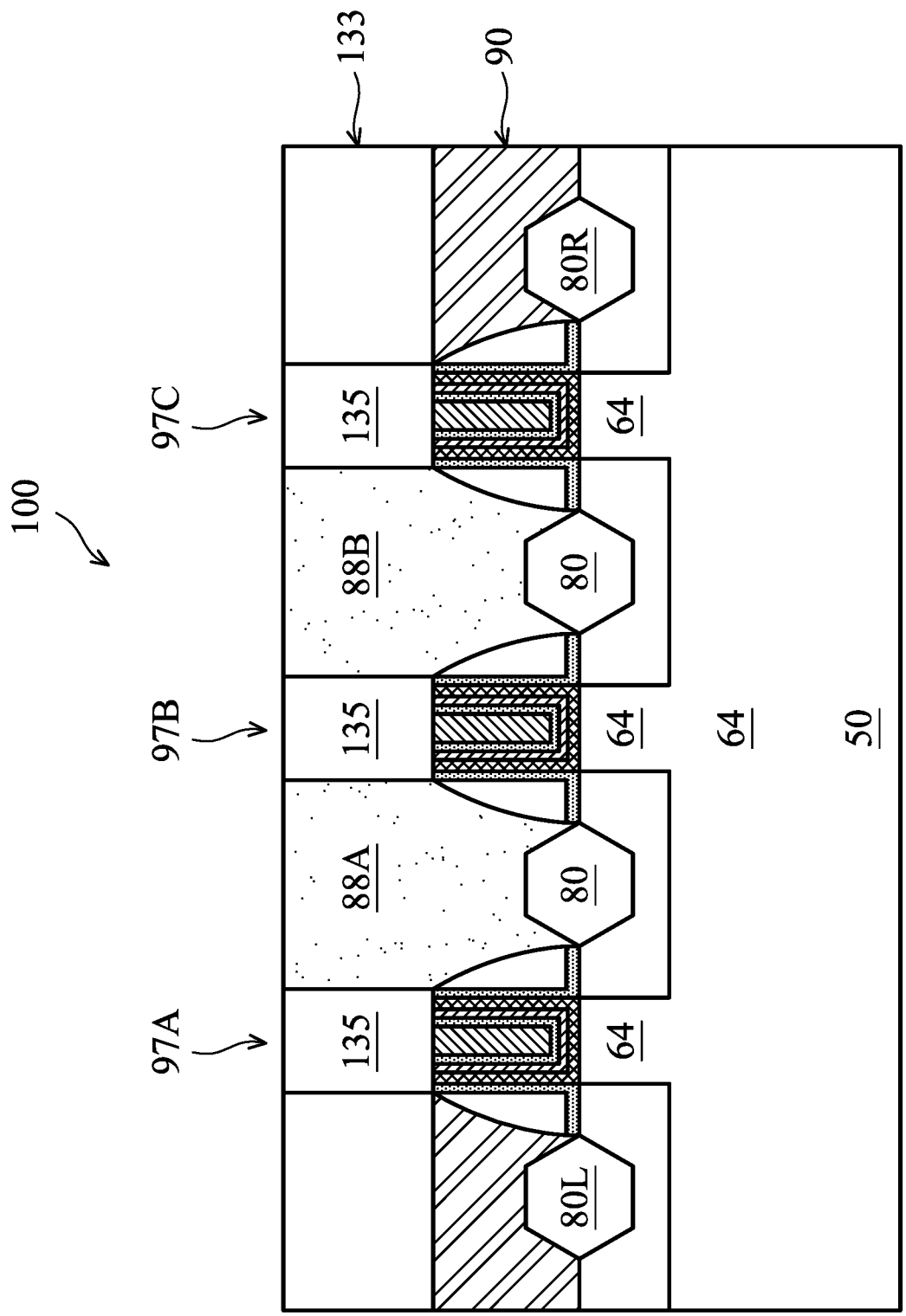

Next, in FIG. 25, a planarization process, such as CMP, is performed to remove upper portions of the conductive material 88 and the patterned mask layer 95. After the planarization process, the upper surface of the hard mask layer 135 and the upper surface of the dielectric layer 133 are exposed, and remaining portions of the conductive material 88 form source/drain contact plugs 88A/88B. As illustrated in FIG. 25, the source/drain contact plugs 88A/88B are formed in a self-aligned manner, and each of the source/drain contact plugs, e.g., source/drain contact plug 88A, extends from the spacer 87 on the a first sidewall of a replacement gate (e.g., 97A) to the spacer 87 on a second sidewall of an adjacent replacement gate (e.g., 97B) facing the first sidewall.

In FIG. 25, no source/drain contact plugs are illustrated for the source/drain regions 80 on the leftmost side (see label 80L) and on the rightmost side (see label 80R). Although not illustrated, the contact plugs for the source/drain regions 80L and 80R may be formed by, e.g., a non-self-aligned method, such as by forming openings through the dielectric layer 133 and the first ILD 90 to expose the source/drain regions 80L and 80R, then filling the openings with conductive materials. In some embodiments, no contact plugs are formed for the source/drain regions 80L and 80R, and in which case, the replacement gate 97A and 97C are not functional gates and serve as dummy gates for formation of the self-aligned source/drain contact plugs 88A/88B for the replacement gate 97B.

Figure 26:
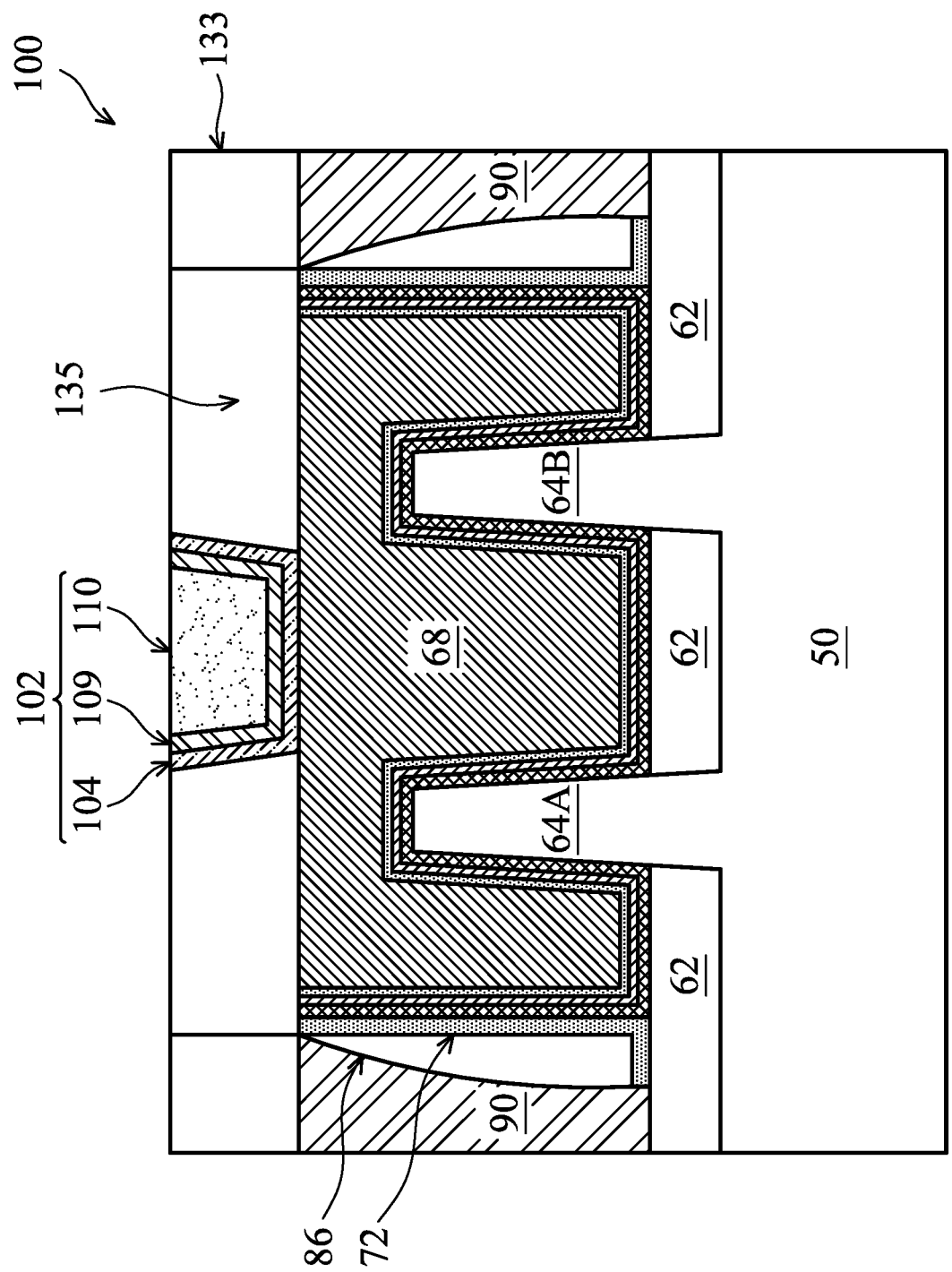

FIG. 26 illustrates the cross-sectional view of the FinFET device 100 in FIG. 25, but along cross-section B-B. In FIG. 26, gate contact 102 is formed. The gate contact 102 may extends through the hard mask layer 135 to electrically connect to the replacement gate 97. As illustrated in FIG. 26, the gate contact 102 includes a barrier layer 104, a seed layer 109, and an electrically conductive material 110, which may be the same or similar to the barrier layer 96, the seed layer 98, and the gate electrode 99 of the replacement gate 97, respectively, thus details are not repeated. Additional layers may be included in the gate contact 102, and the location of the gate contact 102 may be at any suitable location, e.g., at the left end or the right end of the replacement gate 97. These and other variations are fully intended to be included within the scope of the present disclosure.

Figure 27:
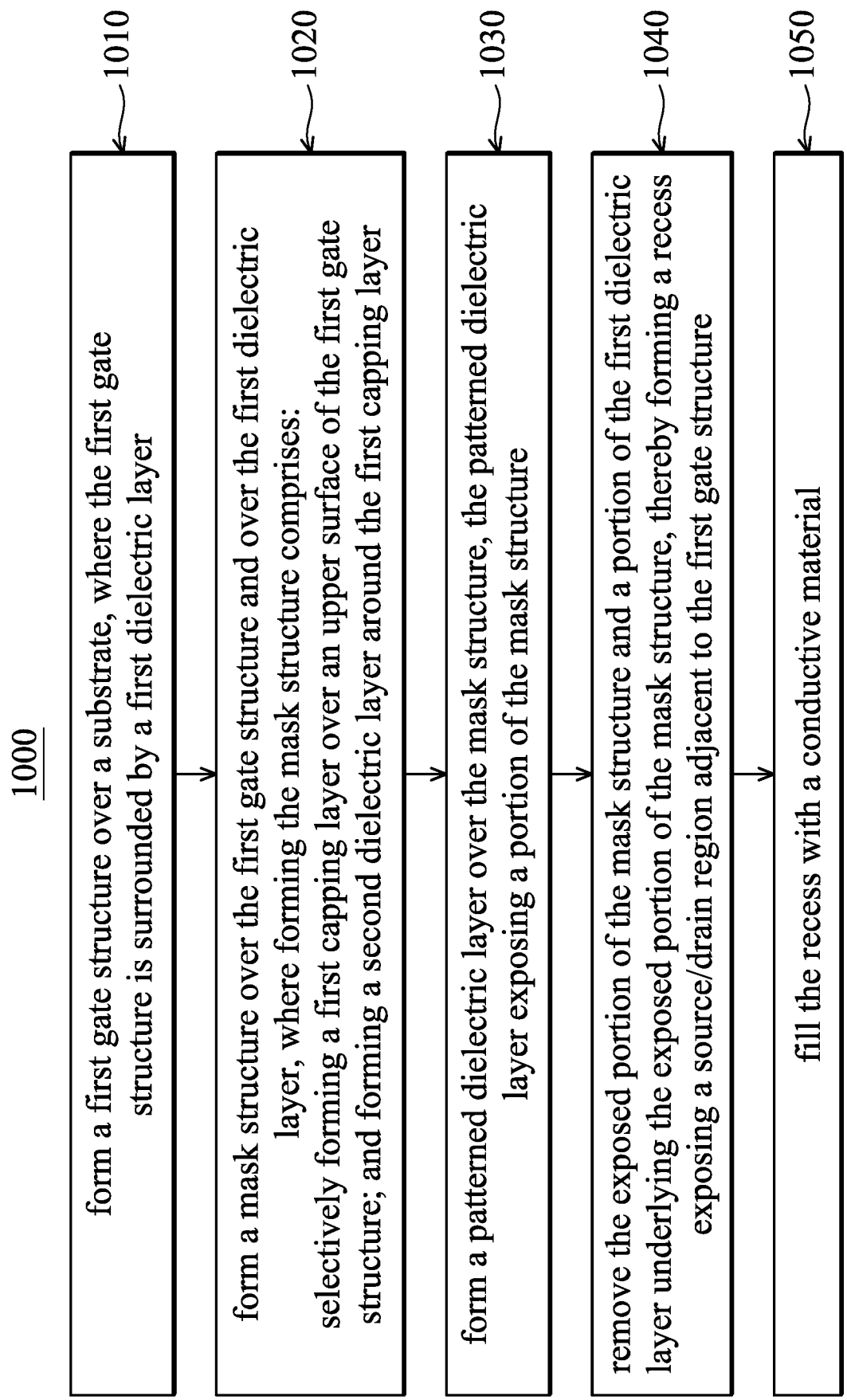
FIG. 27 illustrates a flow chart of method of making a semiconductor device, in accordance with some embodiments.

FIG. 27 illustrates a flow chart of a method of forming a gate dielectric material, in accordance with some embodiments. It should be understood that the embodiment method shown in FIG. 27 is merely an example of many possible embodiment methods. One of ordinary skill in the art would recognize many variations, alternatives, and modifications. For example, various steps as illustrated in FIG. 27 may be added, removed, replaced, rearranged and repeated.

Referring to FIG. 27, at step 1010, a first gate structure is formed over a substrate, where the first gate structure is surrounded by a first dielectric layer. At step 1020, a mask structure is formed over the first gate structure and over the first dielectric layer, where forming the mask structure includes selectively forming a first capping layer over an upper surface of the first gate structure, and forming a second dielectric layer around the first capping layer. At step 1030, a patterned dielectric layer is formed over the mask structure, the patterned dielectric layer exposing a portion of the mask structure. At step 1040, the exposed portion of the mask structure and a portion of the first dielectric layer underlying the exposed portion of the mask structure are removed, thereby forming a recess exposing a source/drain region adjacent to the first gate structure. At step 1050, the recess is filled with a conductive material.

Embodiments may achieve advantages. For example, the mask structure (e.g., 126, 136) disclosed in the present disclosure allows for gate structures (e.g., 97) with much lower heights (e.g., 50 nm to about 80 nm) to be used in a self-aligned source/drain contact plugs formation process. In contrast, a base-line method for forming self-aligned source/drain contact plugs may require a tall gate with gate height of about 150 nm or more to be formed, since the top portion of the gate will be etched back and replaced with a hard mask layer. As gate sizes and the pitches between gates become increasing smaller in advanced processing technology, it may be difficult to form tall gates with high aspect ratios, since the tall gate may collapses easily or may not have good profiles (e.g., having straight sidewalls). The lower gate height, or short gate, enabled by the present disclosure avoids the need to form tall gates, thus allowing gate profile to be well controlled and the reliability of the device to be improved. In addition, lower gate height makes it easier to perform various processing steps such as the implantation process to form source/drain regions between neighboring gates. Further, it is easier to fill in the space between short gates, such as when forming the first ILD 90 between neighboring gates. Other advantages of the present disclosure include larger tolerance for inaccuracies in the photolithography process, and the ability to form capping layers (e.g., 122/122B/122C) with a target thickness and good profile control.

In an embodiment, a method includes forming a first gate structure over a substrate, where the first gate structure is surrounded by a first dielectric layer; and forming a mask structure over the first gate structure and over the first dielectric layer, where forming the mask structure includes selectively forming a first capping layer over an upper surface of the first gate structure; and forming a second dielectric layer around the first capping layer. The method further includes forming a patterned dielectric layer over the mask structure, the patterned dielectric layer exposing a portion of the mask structure; removing the exposed portion of the mask structure and a portion of the first dielectric layer underlying the exposed portion of the mask structure, thereby forming a recess exposing a source/drain region adjacent to the first gate structure; and filling the recess with a conductive material. In an embodiment, forming the mask structure further includes after forming the first capping layer and before forming the second dielectric layer, selectively forming a second capping layer over the first capping layer. In an embodiment, the first capping layer and the second capping layer are formed of a same material that is different from the first dielectric layer, and where sidewalls of the first capping layer are aligned with respective sidewalls of the second capping layer. In an embodiment, selectively forming the first capping layer includes forming a surface treated layer over the first dielectric layer, where the surface treated layer covers an upper surface of the first dielectric layer and exposes the upper surface of the first gate structure, where a first deposition rate of the first capping layer on the surface treated layer is lower than a second deposition rate of the first capping layer on the first gate structure; and supplying one or more precursors for forming the first capping layer to the exposed upper surface of the first gate structure and to the surface treated layer. In an embodiment, the first capping layer comprises silicon nitride, and the first dielectric layer comprises silicon oxide. In an embodiment, supplying one or more precursors includes supplying a first precursor comprising dichlorosilane ($H_2SiCl_2$) and a second precursor comprising ammonia ($NH_3$) to the exposed upper surface of the first gate structure and to the surface treated layer. In an embodiment, forming the surface treated layer includes converting an upper portion of the first dielectric layer into the surface treated layer by performing an in-situ HF vapor cleaning process. In an embodiment, performing the in-situ HF vapor cleaning process includes supplying a vapor comprising azeotropic $HF/H_2O$, azeotropic $HCl/H_2O$, $H_2O$, and high purity isopropyl alcohol (IPA) to a surface of the first dielectric layer. In an embodiment, the first capping layer comprises a metal, and where forming the mask structure further includes growing carbon nanotubes on the first capping layer after selectively forming the first capping layer and before forming the second dielectric layer; and after forming the second dielectric layer, removing the carbon nanotubes and the first capping layer to form an opening in the second dielectric layer; and filling the opening with a third dielectric material. In an embodiment, the metal is cobalt or iron. In an embodiment, growing carbon nanotubes comprises supplying a precursor comprising acetylene to an upper surface of the first capping layer.

In an embodiment, a method includes forming a first gate over a substrate; forming a second gate over the substrate and adjacent to the first gate, the first gate and the second gate being embedded in a first dielectric material; forming a capping layer on the first gate and on the second gate; growing carbon nanotubes on the capping layer; forming a second dielectric material over the first dielectric material and around the carbon nanotubes; removing the carbon nanotubes and the capping layer to form first recesses in the second dielectric material; filling the first recesses with a third dielectric material, thereby forming a first hard mask over the first gate and a second hard mask over the second gate; removing a portion of the second dielectric material between the first hard mask and the second hard mask and a portion of the first dielectric material between the first gate and the second gate, thereby forming a second recess; and filling the second recess with a conductive material. In an embodiment, forming the capping layer includes selectively forming a metal layer over a first upper surface of the first gate and over a second upper surface of the second gate. In an embodiment, growing the carbon nanotubes includes supplying a gas comprising carbon to the capping layer. In an embodiment, removing the carbon nanotubes and the capping layer includes removing the carbon nanotubes in a first etching process; and after removing the carbon nanotubes, removing the capping layer in a second etching process different from the first etching process. In an embodiment, the first etching process is a dry etch process, and the second etching process is a wet etch process.

In an embodiment, a semiconductor device includes a first gate over a substrate; first gate spacers along sidewalls of the first gate; a second gate over the substrate and adjacent to the first gate; second gate spacers along sidewalls of the second gate, the first gate and the second gate being surrounded by a first dielectric material; a first capping layer over a first upper surface of the first gate and over a second upper surface of the second gate, the first capping layer and the first dielectric material comprising different materials; a second capping layer over the first capping layer, the first capping layer and the second capping layer comprising a same dielectric material, sidewalls of the first capping layer being aligned with respective sidewalls of the second capping layer; a second dielectric material over the first dielectric material, the second dielectric material surrounding the first capping layer and the second capping layer; and an electrically conductive material between the first gate and the second gate, the electrically conductive material extending from a first one of the first gate spacers to a first one of the second gate spacers. In an embodiment, the first capping layer and the second capping layer comprise silicon nitride, and the first dielectric layer comprises silicon oxide. In an embodiment, the first capping layer is a lowermost capping layer, and the second capping layer is an uppermost capping layer, where an upper surface of the second dielectric material is level with an upper surface of the second capping layer. In an embodiment, an upper surface of the electrically conductive material is level with the upper surface of the second dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate structure over a substrate, wherein the gate structure is surrounded by a first dielectric layer;
   forming a mask structure over the gate structure and over the first dielectric layer, wherein the mask structure comprises a dielectric structure over the gate structure and over gate spacers of the gate structure, and a second dielectric layer over the first dielectric layer around the dielectric structure;

forming a patterned dielectric layer over the mask structure, the patterned dielectric layer exposing a portion of the second dielectric layer and a portion of the dielectric structure;

removing the exposed portion of the second dielectric layer and a portion of the first dielectric layer underlying the exposed portion of the second dielectric layer, thereby forming a recess exposing a source/drain region adjacent to the gate structure; and filling the recess with a conductive material.

2. The method of claim 1, wherein the dielectric structure comprises one or more capping layers, wherein forming the mask structure comprises:

selectively forming a first capping layer over the gate structure and over the gate spacers; and forming the second dielectric layer over the first dielectric layer around the first capping layer.

3. The method of claim 2, wherein the first capping layer is formed of a different material from the first dielectric layer, and wherein the second dielectric layer is formed of a same material as the first dielectric layer.

4. The method of claim 2, further comprising, after forming the first capping layer and before forming the second dielectric layer, selectively forming a second capping layer over the first capping layer, wherein sidewalls of the second capping layer are aligned with respective sidewalls of the first capping layer.

5. The method of claim 4, wherein an upper surface of the second capping layer is level with an upper surface of the second dielectric layer distal from the substrate.

6. The method of claim 2, further comprising, before forming the first capping layer, converting an upper layer of the first dielectric layer into a surface treated layer.

7. The method of claim 6, wherein a first deposition rate of the first capping layer on the surface treated layer is lower than a second deposition rate of the first capping layer on the gate structure.

8. The method of claim 6, wherein converting the upper layer of the first dielectric layer comprises performing a cleaning process by supplying a vapor comprising HF to the first dielectric layer.

9. The method of claim 1, wherein forming the mask structure comprises:

selectively forming a capping layer on the gate structure;
growing carbon nanotubes on the capping layer;
forming the second dielectric layer over the first dielectric layer around the capping layer and around the carbon nanotubes;
after forming the second dielectric layer, removing the carbon nanotubes and the capping layer to form an opening in the second dielectric layer; and
filling the opening with a third dielectric material, wherein the third dielectric material in the opening forms the dielectric structure.

10. The method of claim 9, wherein the capping layer is formed of cobalt or iron.

11. The method of claim 10, wherein growing the carbon nanotubes comprises supplying a precursor comprising carbon to an upper surface of the capping layer.

12. A method comprising:

forming a gate structure over a substrate, the gate structure being surrounded by a first dielectric material;
growing carbon nanotubes on the gate structure;
forming a second dielectric material over the first dielectric material and around the carbon nanotubes;
replacing the carbon nanotubes with a third dielectric material;
removing a portion of the second dielectric material and a portion of the first dielectric material that are adjacent to the gate structure to form a recess; and
filling the recess with a conductive material.

13. The method of claim 12, further comprising, before growing the carbon nanotubes, forming a capping layer on the gate structure, wherein the carbon nanotubes are grown on the capping layer.

14. The method of claim 13, wherein the capping layer is formed of cobalt or iron.

15. The method of claim 14, wherein replacing the carbon nanotubes comprises:

removing the carbon nanotubes in a first etching process;
after removing the carbon nanotubes, removing the capping layer in a second etching process different from the first etching process, wherein an opening is formed in the second dielectric material by the removal of the carbon nanotubes and the capping layer; and
forming the third dielectric material in the opening of the second dielectric material.

16. The method of claim 14, wherein growing the carbon nanotubes comprises supplying a precursor comprising acetylene to an upper surface of the capping layer.

17. A method comprising:

forming a gate structure over a substrate, wherein the gate structure is surrounded by a first dielectric layer;
selectively forming a first capping layer over the gate structure and over gate spacers of the gate structure;
selectively forming a second capping layer over the first capping layer;
forming a second dielectric layer over the first dielectric layer around the first capping layer and the second capping layer;
forming a patterned mask layer over the second dielectric layer and the second capping layer, an opening in the patterned mask layer exposing the second dielectric layer and the second capping layer;
removing a portion of the second dielectric layer and a portion of the first dielectric layer under the opening of the patterned mask layer, thereby forming a recess exposing a source/drain region adjacent to the gate structure; and
filling the recess with a conductive material.

18. The method of claim 17, further comprising, before forming the first capping layer, converting an upper portion of the first dielectric layer into a surface treated layer.

19. The method of claim 18, wherein converting the upper portion of the first dielectric layer comprises supplying a vapor comprising HF to an upper surface of the first dielectric layer.

20. The method of claim 17, wherein the first dielectric layer and the second dielectric layer comprise a same first material, and wherein the first capping layer and the second capping layer comprise a same second material, wherein the second material has a slower etching rate than the first material.

* * * * *